(12) United States Patent
Arimoto

(10) Patent No.: US 6,333,889 B1
(45) Date of Patent: Dec. 25, 2001

(54) LOGIC-MERGED SEMICONDUCTOR MEMORY HAVING HIGH INTERNAL DATA TRANSFER RATE

(75) Inventor: Kazutami Arimoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/645,352

(22) Filed: Aug. 25, 2000

(30) Foreign Application Priority Data

Aug. 31, 1999 (JP) .................................................. 11-244963

(51) Int. Cl.$^7$ .................................. G11C 8/00; G11C 5/06
(52) U.S. Cl. .......................... 365/230.03; 365/51; 365/63; 365/69
(58) Field of Search ................................ 365/51, 63, 233, 365/230.03, 69, 238.5

(56) References Cited

U.S. PATENT DOCUMENTS 5,812,478 * 9/1998 Okamura ........................ 365/230.03
6,163,475 * 12/2000 Proebsting .............................. 365/63
6,172,918 * 1/2001 Hidaka ........................... 365/189.11

FOREIGN PATENT DOCUMENTS 4-212779    8/1992  (JP) .
11-68055    3/1999  (JP) .

OTHER PUBLICATIONS

"400MHz Random Column Operating SDRAM Techniques with Self Skew Compensation" by Hamamoto et al., 1997 Symposium on VLSI Circuits Digest of Technical Papers, pp. 105–106.

* cited by examiner

*Primary Examiner*—Son Mai
(74) *Attorney, Agent, or Firm*—McDermott, Will & Emery

(57) ABSTRACT

Two memory sub arrays are provided adjacent to a read/write circuit. An internal data line pair corresponding to the memory sub array located farther away is connected to the read/write circuit via a feed-through line pair (FLP) located at an upper layer above the memory sub array located closer. The internal data line pair for the memory sub array located closer is coupled to the read/write circuit. The number of bits of the internal data transfer can be increased by carrying out column selection simultaneously under the state where the word lines are selected simultaneously in the two memory sub arrays. The internal data transfer rate in a semiconductor memory device is increased.

21 Claims, 23 Drawing Sheets

LOGIC-MERGED SEMICONDUCTOR MEMORY HAVING HIGH INTERNAL DATA TRANSFER RATE

BACKGROUND OF THE INVENTION

1. Field of the Invention

The present invention relates to semiconductor memory devices, and particularly to a semiconductor memory device that operates in synchronization with a clock signal. More particularly, the present invention relates to a structure to improve the internal data transfer rate of a logic-merged DRAM (Dynamic Random Access Memory).

2. Description of the Background Art

In a semiconductor integrated circuit device in which a logic and a memory are formed on the same chip, the data bus width between the logic and the memory can be increased without restriction of the number and pitch of pin terminals. Increase of the data bus width between the logic and the memory allows more data bits to be transferred at one time. The data transfer rate can be improved significantly than the case where a discrete memory is used.

FIG. 33 schematically shows a structure of a conventional logic-merged DRAM. Referring to FIG. 33, the DRAM includes memory cell sub arrays MB#0–MB#m having a plurality of memory cells arranged in rows and columns, and sense amplifier bands SA#0–SA#n provided corresponding to memory cell sub arrays MB#0–MB#m. In each of memory cell sub arrays MB#0–MB#m, a word line WL is arranged corresponding to a memory cell row. A bit line pair is arranged corresponding to a memory cell column. In FIG. 33, one bit line pair BLP, word line WL, and a memory cell MC arranged at the crossing thereof in memory cell sub array MB#0 are shown representatively.

Sense amplifier bands SA#0–SA#n each include sense amplifier circuits provided corresponding to columns of corresponding memory cell sub arrays, and column select gates provided corresponding to respective sense amplifier circuits. A sense amplifier band (SA#1, . . . ) arranged between the memory cell sub arrays are shared by adjacent memory cell sub arrays.

The DRAM further includes row decoders RD#0–RD#m provided corresponding to memory cell sub arrays MB#0–MB#m, respectively, to drive a word line corresponding to an addressed row to a selected state, column decoders CD#0–CD#n provided corresponding to sense amplifier bands SA#0–SA#, respectively to generate a column select signal selecting a sense amplifier circuit provided corresponding to an addressed column according to a column address signal, and internal data line pairs IOPs arranged extending in the column direction common to memory cell sub arrays MB#0–MB#m to transfer data with a sense amplifier circuit provided corresponding to selected columns. Internal data line pair IOP includes complementary data lines, and is arranged along a column direction extending over memory cell sub arrays MB#0–MB#m.

Internal data line pair IOP is coupled to a read/write circuit W/P. Read/write circuit W/P is coupled to an input/output circuit QDB that inputs/outputs data with respect to a logic circuit not shown.

As shown in FIG. 33, the internal data bus width can be increased by arranging internal data line pairs IOP along the column direction over memory cell sub arrays MB#0–MB#m. Therefore, the number of data bits transferred at one time can be increased.

FIG. 34 schematically shows a structure of the memory cell sub array and sense amplifier band. Referring to FIG. 34, memory cell sub array MB# includes word lines WL arranged corresponding to rows of memory cells MC, each word line connected to a corresponding row of memory cells MC, and a plurality of bit line pairs BLP arranged corresponding to columns of memory cells MC, each bit line pair connected to a corresponding column of memory cells. Bit line pair BLP includes complementary bit lines BL and /BL. Memory cell MC is arranged corresponding to the crossing of one of bit lines BL and/BL and a word line WL. In FIG. 34, a memory cell MC arranged corresponding to the crossing of bit line BL and word line WL is shown.

Sense amplifier band SA# includes a sense amplifier circuit SA provided corresponding to a bit line pair BLP, and a column select gate CG arranged corresponding to sense amplifier circuit SA and rendered conductive according to a column select signal CSL from a corresponding column decoder. In sense amplifier band SA#, four sense amplifier circuits SA#0–SA3 form one sense amplifier group SAG. In FIG. 34, three sense amplifier groups SAG0–SAG2 are shown. A column specific signal on column select lines CSL0–CSL3 is applied to column select gates CG0–CG3 provided corresponding to the four sense amplifier circuits SA0–SA3, respectively.

In the arrangement shown in FIG. 34, one sense amplifier circuit (column) is selected in respective sense amplifier group SAG0–SAG2, . . .

Internal data line pair IOP is arranged corresponding to sense amplifier groups SAG0–SAG2, . . . , respectively. Internal data line pair IOP includes complementary data lines I/O and I/O to transfer complementary data. Internal data lines I/O0, /I/O0–I/O2, /I/O2 are arranged corresponding to sense amplifier groups SAG0–SAG2, respectively. A selected sense amplifier circuit is connected to a corresponding pair of internal data lines I/O, /I/O.

In the arrangement shown in FIG. 34, the column select is 1-out-of-4 selection. ¼ of memory cells are selected out of one row of memory cells. For example, since there are 512 sense amplifier circuits SA in the case where 512 bits of memory cells MC are arranged in one row, 128 internal data line pairs IOP are provided. Thus, 128 sense amplifier circuits (memory cell) are selected simultaneously and connected to corresponding internal data line pairs IOP according to column select lines CSL0–CSL3, so that memory cell data of 128 bits can be transferred at a time. In the shared sense amplifier structure, sense amplifiers are arranged at both sides of memory cell block MB# in the column direction. The number of sense amplifier circuits in one sense amplifier band is 64, and the sense amplifier bands at both sides of a selected memory cell block are activated simultaneously.

The data on internal data line pair IOP is coupled to read/write circuit W/P of FIG. 33. In a data readout operation, the data held in sense amplifier circuits SAi (i=0–3) on the selected columns are transferred in parallel to preamplifiers in read/write circuit W/P of FIG. 33 via internal data line pairs IOP. Then, the data are transferred to the logic circuit via input/output circuit QDB at a predetermined sequence in synchronization with a clock signal. In data transfer from input/output circuit QDB, the number of internal transfer bits is adjusted according to the data bus width between the logic circuit and the DRAM. Data of a bit width equal to the number of memory cells in one row can be transferred simultaneously at maximum.

FIG. 35 schematically shows an interconnection layer of a memory array portion. In FIG. 35, bit line BL (/BL) is formed of refractory metal such as tungsten or refractory metal silicide. Above bit line BL (/BL), column select line CSL and word line WL are formed of a first level aluminum interconnection (1Al) lines parallel to each other. Above column select line CSL and word line WL, internal data line I/O (/I/O) is formed of a second level aluminum interconnection (2Al) line. Internal data line I/O (/I/O) is arranged parallel to bit line BL. In the case where the line capacitance of bit lines BL and /BL is increased, the noise of an adjacent bit line is overlaid by capacitive coupling to degrade the operational margin of the sense amplifier during the sense operation, i.e., when amplifying small readout voltage (memory cell data) on bit line BL or /BL. Therefore, film thickness of bit lines BL and /BL must be reduced to reduce the capacitance between the bit lines. The pitch of bit lines BL and /BL becomes smaller than that of internal data lines I/O and /I/O, and the aspect ratio of the bit lines becomes large when the film thickness becomes greater. It therefore becomes difficult to carry out the etching process on the bit lines. Since bit lines BL and /BL are located below word line WL, column select line CSL and internal data lines I/O and /I/O, increase in the film thickness of bit lines BL and /BL causes a stepped portion of the overlying interconnection layer or word line WL and column select line CSL to become greater to induce the possibility of disconnection. Taking into consideration the above factors, the film thickness of bit lines BL and /BL is made as small as possible.

Internal data lines I/O and /I/O are formed of the second level aluminum interconnection lines. The second level aluminum interconnection lines are also used as a power supply line to transmit power supply voltage Vcc and ground voltage GND and as a signal line to transmit a signal over a relatively long distance. It is therefore necessary to set the impedance as low as possible. Accordingly, the film thickness of the second level aluminum interconnection (2Al) line is made thick. The pitch of internal data lines I/O and /I/O is set greater than the bit line pitch, and one pair of internal data lines IOP is provided for four sense amplifier circuits, for example, because of the following reasons.

Since the aspect ratio is increased when the film thickness is great, it will be difficult to carry out anisotropic etching precisely to pattern internal data lines I/O and /I/O. When the etching process is not carried out properly, the edge of an interconnection line may not be etched away to cause shorting with an adjacent aluminum interconnection line that is not yet etched. In the case of a large line capacitance, noise is overlaid on a data signal during data transfer due to capacitive coupling through the line capacitance. The amplitude of the complementary data signals becomes smaller, and the operational margin of the preamplifier is degraded.

In order to avoid these problems, the pitch of internal data lines I/O and /I/O is set sufficiently greater than the bit line pitch, for example, to 4 times the bit line pitch. Therefore, the data latched in sense amplifier circuit SA cannot be transferred at one time. Thus, it was difficult to increase the band width of data transfer with the logic circuit.

SUMMARY OF THE INVENTION

An object of the present invention is to provide a semiconductor memory device that can have an increased data transfer rate of an internal data bus.

Another object of the present invention is to provide a semiconductor memory device that can have the data transfer rate on an internal data line improved without modifying the internal data line pitch condition.

According to an aspect of the present invention, a semiconductor memory device includes a plurality of memory blocks each having a plurality of memory cells arranged in rows and columns, and the memory blocks divided into first and second sub arrays along the column direction, a plurality of sense amplifiers provided corresponding to columns of the plurality of memory blocks for sensing and amplifying memory cell data of corresponding columns when activated, and a plurality of internal data lines arranged extending along a column extending direction, each internal data line being provided corresponding to a predetermined number of sense amplifier circuits for one memory block. The plurality of internal data lines include a first internal data line group for the first sub array and a second internal data line group provided for the second sub array. The first internal data line group includes a feed-through line arranged extending in the column direction over the second sub array, and at an interconnection layer differing from that of the second internal data line group.

The semiconductor memory device of the present aspect further includes a plurality of column select circuits provided corresponding to each of the plurality of sense amplifier circuits and each of the plurality of internal data lines, coupling corresponding sense amplifier circuits with corresponding internal data lines according to a column specifying signal.

According to another aspect of the present invention, a semiconductor memory device includes a plurality of blocks, each block having a plurality of memory cells arranged in rows and columns and the memory blocks divided into first and second sub arrays along a column direction, a plurality of internal data lines extending along a column extending direction, each internal data line provided corresponding to a predetermined number of sense amplifier circuits for one memory block, a plurality of sense amplifier circuits provided corresponding to columns of the plurality of memory blocks for sensing and amplifying memory cell data of corresponding columns when activated, a plurality of word lines provided corresponding to respective memory cell rows, a row select circuit for driving to a selected state a word line arranged corresponding to an addressed row simultaneously in each of a predetermined number of memory blocks in the first and second sub arrays according to a row address signal, a column specify signal generation circuit provided corresponding to the memory blocks for generating a column specify signal specifying a column in a specified memory block according to a column address signal and a memory block specify address signal provided at a time, and a plurality of column select circuits provided corresponding to respective sense amplifier circuits and provided corresponding to internal data lines, for coupling sense amplifier circuits of corresponding columns with corresponding internal data lines in response to a column specify signal from the column specify signal generation circuit.

According to a further aspect of the present invention, a semiconductor memory device includes a plurality of memory blocks each having a plurality of memory cells arranged in rows and columns, a plurality of sense amplifier circuits provided corresponding to columns of the plurality of memory blocks for sensing and amplifying data of memory cells of corresponding columns when activated, and a plurality of internal data lines extending along a column extending direction, each internal data line provided corresponding to a predetermined number of sense amplifier circuits for one memory block. One internal data line is provided corresponding to a predetermined number of sense amplifier circuits, and one internal data line transfers data of one bit.

The semiconductor memory device of the further aspect further includes a plurality of column select circuits provided corresponding to the plurality of sense amplifiers and the plurality of internal data lines, coupling corresponding sense amplifier circuits with corresponding internal data lines according to a column select signal.

According to still another aspect of the present invention, a semiconductor memory device includes a plurality of memory blocks, each including a plurality of memory cells arranged in rows and columns. The plurality of memory blocks are divided into a plurality of banks that can drive a row to a selected state independent of each other.

The semiconductor memory device of the instant aspect further includes a plurality of row select circuits provided corresponding to the plurality of banks for driving, when a corresponding bank is addressed, according to a bank specify bank address signal and a row specify row address signal applied at the same time a plurality of addressed rows simultaneously in a corresponding bank to a selected state, a plurality of column select circuits provided corresponding to the plurality of banks, to select simultaneously a plurality of columns in respective banks according to a bank address signal and a column specify column address signal applied at the same time, and a plurality of internal data lines provided extending in the column direction common to the plurality of banks, coupling simultaneously a plurality of columns selected by the plurality of column select circuits.

According to a still further aspect of the present invention, a semiconductor memory device includes a plurality of first memory blocks each having a plurality of memory cells arranged in rows and columns and divided into first and second sub arrays along the column direction, a plurality of second memory blocks each having a plurality of memory cells arranged in rows and columns, and divided into third and fourth sub arrays along the column direction, a plurality of first internal data lines each provided corresponding to a predetermined number of sense amplifier circuits for one of the first memory blocks, and a plurality of second internal data lines extending along the column extending direction, each second internal data line provided corresponding to a predetermined number of sense amplifier circuits for one of the second memory blocks.

The plurality of first internal data lines include an internal data line group provided corresponding to the first sub array, and a second internal data line group provided corresponding to the second sub array. The internal data line group provided corresponding to the first sub array block includes a first feed-through line arranged extending over the second sub array and at an interconnection layer differing from that of the internal data line group provided corresponding to the second sub array. The plurality of second internal data lines include a third internal data line group provided corresponding to the third sub array block, and a fourth internal data line group provided corresponding to the fourth sub array. The fourth internal data line group provided corresponding to the fourth sub array includes a second feed-through line arranged extending over the third sub array, and at an interconnection layer differing from that of the third internal data line group provided corresponding to the third sub array.

The semiconductor memory device of the instant aspect further includes a read/write circuit arranged between the first memory block and the second memory block to transfer data with the first and second internal data lines.

According to yet a further aspect of the present invention, a semiconductor memory device includes a plurality of memory blocks, each having a plurality of memory cells arranged in rows and columns, a plurality of sense amplifier circuits provided corresponding to columns of the plurality of memory blocks for sensing and amplifying memory cell data of corresponding columns when activated, a plurality of internal data lines, each internal data line provided corresponding to a predetermined number of sense amplifier circuits for one memory block, an internal clock generation circuit frequency-multiplying a clock signal corresponding to an external clock signal for generating an internal clock signal, a column select signal generation circuit operating in synchronization with the internal clock signal for selecting a column according to an address signal applied in synchronization with the external clock signal, and a column select circuit provided corresponding to the plurality of memory blocks for connecting addressed columns to the plurality of internal data lines according to a column specify signal from column select signal generation circuit.

The provision of a feed-through line in the internal data line allows the sense amplifier circuits in the first and second sub arrays to be connected simultaneously to the internal data lines. The data held in the sense amplifier circuit can be transferred at two times the rate without modifying the internal data line pitch condition.

By driving a plurality of word lines simultaneously to a selected state and selecting a column according to a column address signal and a memory sub array specify address signal, the sense amplifier circuits and the internal data lines can be connected in synchronization with the clock signal without page switching. Thus, the data transfer rate can be increased.

By selecting a plurality of word lines simultaneously in each bank and selecting a column according to a bank address and a column address according to the bank configuration, data can be transferred in synchronization with a clock signal without page switching overhead in one bank.

By providing a read/write circuit at the center of the array blocks and transferring data on the first and second sub arrays and from the third and fourth sub arrays arranged at both sides, data of the number of bits identical to the number of sense amplifier circuits in one sense amplifier band can be transferred at the same time without modifying the memory data line pitch condition.

The data transfer rate on the internal data lines can be improved by increasing the operating frequency of the column select operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
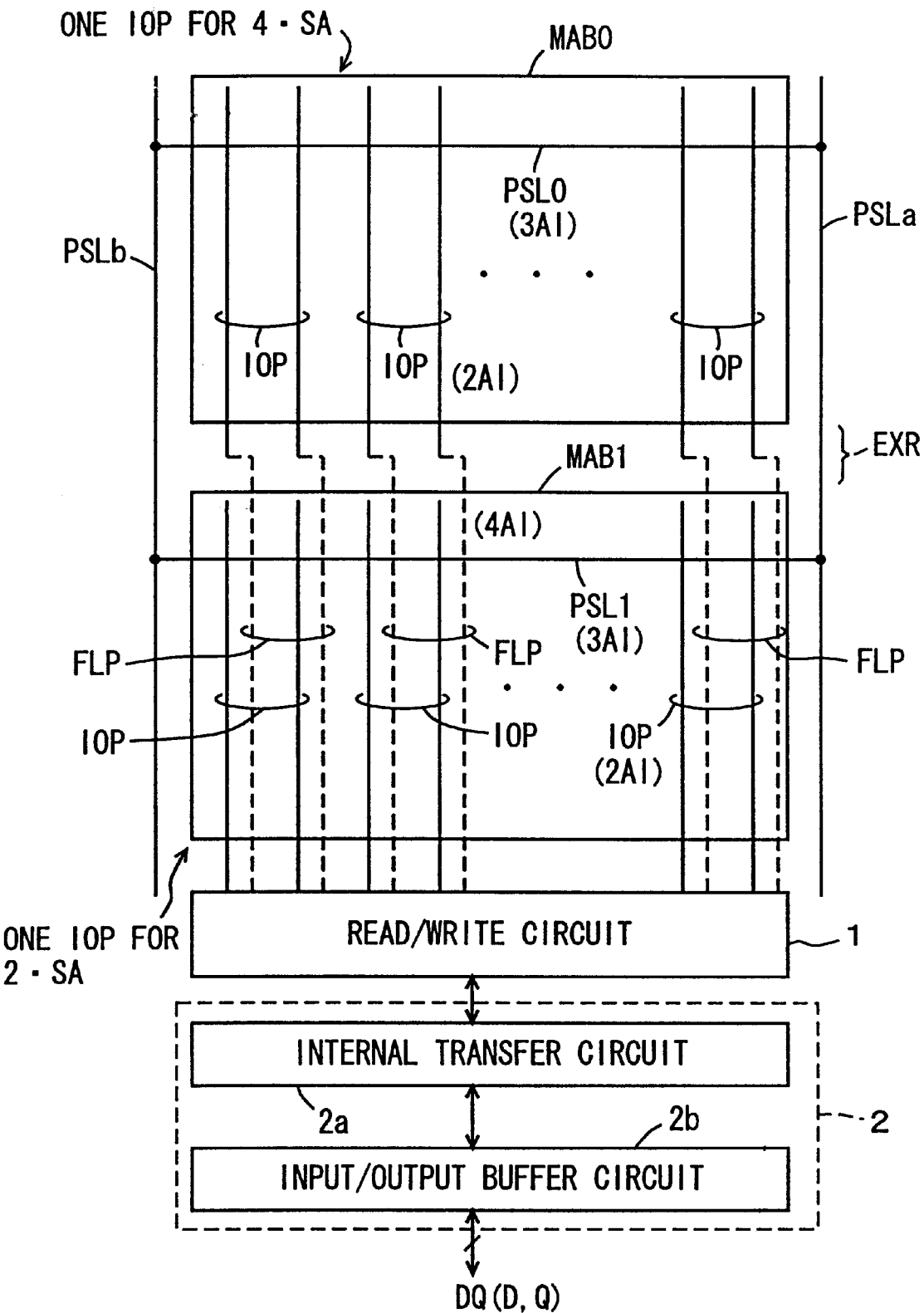
FIG. 1 schematically shows an entire structure of a semiconductor memory device according to a first embodiment of the present invention.

FIG. 1 schematically shows a structure of a main part of a semiconductor memory device according to the first embodiment of the present invention. In FIG. 1, the memory array is divided into memory sub arrays MAB0 and MAB1. In each of memory sub arrays MAB0 and MAB1, one internal data line pair IOP is arranged per four sense amplifier circuits (SA) in one sense amplifier band. Internal data line pair IOP is formed of, for example, a second level aluminum interconnection line (2Al).

Internal data line pair IOP provided for memory sub array MAB0 is connected to feed-through line pair FLP which is at an upper layer in a line exchange region EXR. This feed-through line pair FLP is arranged over memory sub array MAB1 extending in the column direction. Feed-through line pair is formed of, for example, a fourth aluminum interconnection line (4Al) which is at a layer upper than internal data line pair IOP. Above memory sub array MAB1, internal data line pair IOP and feed-through line pair FLP are formed at different interconnection layers. Therefore, feed-through line pair FLP and internal data line pair IOP can be arranged in memory array block MAB1 with sufficient margin.

In each of memory sub arrays MAB0 and MAB1, power supply lines PSL0 and PSL1 are arranged to transmit an operating power supply voltage to a sense amplifier circuit not shown. Power supply lines PSL0 and PSL1 are formed of, for example, the third level aluminum interconnection line (3Al). The sense power supply line is at an interconnection layer differing from the layers of internal data line pair IOP and feed-through line pair FLP. Therefore, internal data line pair IOP and feed-through line pair FLP can be arranged without collision of the interconnection.

Power supply lines PSL0 and PSL1 are connected to power supply lines PSLa and PSLb that are arranged extending in the column direction outside memory sub arrays MAB0 and MAB1 to enhance the power supply.

Feed-through line pair FLP and internal data line pair IOP of memory sub array MAB1 are coupled to a read/write circuit 1. In each of memory sub arrays MAB0 and MAB1, one internal data line pair IOP is arranged for four sense amplifier circuits with respect to one sense amplifier band. Therefore, in read/write circuit 1, internal data line pairs equivalently identical in number to the structure in which one internal data line pair is provided for two sense amplifier circuits with respect to one sense amplifier band are coupled. Therefore, the number of data bits that can be transferred at one time can be increased.

Read/write circuit 1 is coupled to an input/output circuit 2 that inputs/outputs data in synchronization with a clock signal. Input/output circuit 2 includes an internal transfer circuit 2a having a latch circuit and the like to transfer data in synchronization with an internal clock signal not shown, and an input/output buffer circuit 2b that transfers data with an external source of the memory device. Input/output circuit 2b may be implemented so that write data D and read data Q are input/output via the same node, or via different nodes.

By arranging internal data line pair IOP and feed-through line pair FLP in different interconnection layers in memory sub array MAB1 as shown in FIG. 1, the bits width of the internal data bus can be increased without modifying the pitch condition of the internal data line pairs.

Figure 2:
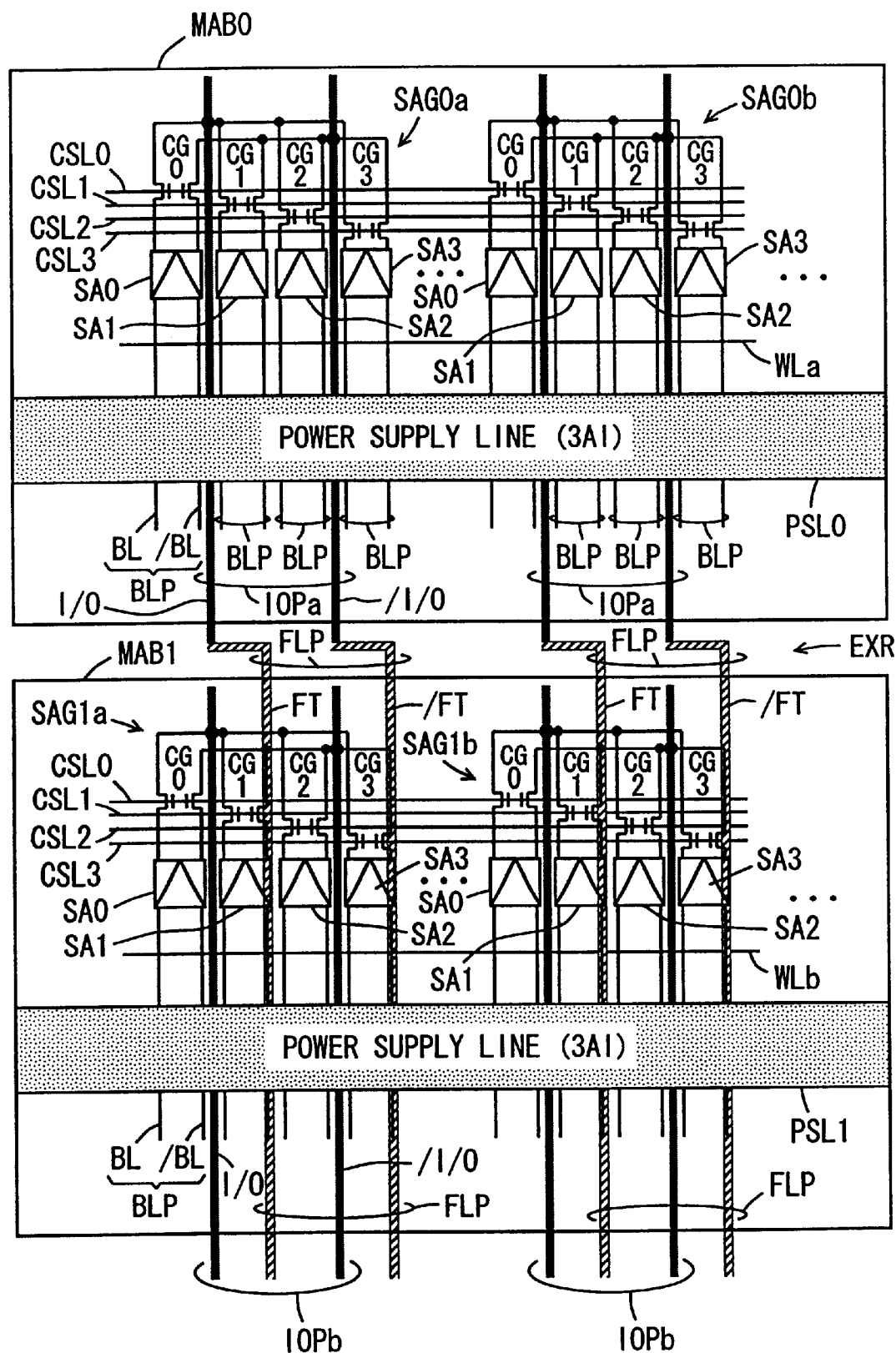
FIG. 2 shows in detail the memory sub array of FIG. 1.

Referring to FIG. 2 that shows the structure of memory sub arrays MAB0 and MAB1 of FIG. 1 in more detail, memory sub array MAB0 includes sense amplifier groups SAG0a, . . . SAG0b, each group including four sense amplifier circuits SA0–SA3. Memory sub array MAB1 includes sense amplifier groups SAG1a . . . SAG1b, each sense amplifier group including four sense amplifier circuits SA0–SA3. In each of sense amplifier groups SAG0a, SAG0b, SAG1a and SAG1b, column select gates CG0–CG3 each receiving a signal on a column select line at a gate thereof are provided for sense amplifier circuits SA0–SA3, respectively. Each of sense amplifier circuits SA0–SA3 is coupled to bit line pair BLP formed by bit lines BL and /BL.

An internal data line pair IOPa is arranged for each of sense amplifier groups SAG0a and SAG0b. Internal data line pair IOPa includes complementary internal data lines I/O and /I/O. Internal data line pair IOPa is coupled to feed-through line pair FLP which is at the upper layer in line exchange region EXR. Feed-through line pair FLP includes feed-through lines FT and /FT corresponding to internal data lines I/O and /I/O, respectively. Feed-through lines FT and /FT are arranged extending in the column direction over memory sub array MAB1.

Similarly in memory sub array MAB1, an internal data line pair IOPb is arranged corresponding to each of sense amplifier groups SAG1a and SAG1b. Internal data line pair IOPb provided for memory sub array MAB1 is coupled to read/write circuit 1 shown in FIG. 1. Also, a feed-through line pair FLP is coupled to read/write circuit 1 shown in FIG. 1.

In each of memory sub arrays MAB0 and MAB1, the pitch of internal data line pairs is four times the pitch of the bit lines. Therefore, internal data lines I/O and /I/O can be arranged in memory sub arrays MAB0 and MAB1 with margin.

Feed-through lines FT and /FT are at an interconnection layer upper than the layer of internal data lines I/O and /I/O. In sub array MAB1, internal data lines I/O and /I/O and feed-through lines FT and /FT can be arranged without modifying the pitch condition.

In memory sub arrays MAB0 and MAB1, word lines WLa and WLb card are driven to a selected state at the same time. Therefore, read/write circuit 1 of FIG. 1 can transfer data simultaneously via internal data line pair IOPb and feed-through line pair FLP to realize internal data transfer of high speed.

Also, power supply lines PSL0 and PSL1 transmitting the power supply voltage to sense amplifier circuits SA0–SA3 are arranged extending in the row direction. Power supply lines PSL0 and PSL1 provide the following advantages since they are formed of a third level aluminum interconnection (3Al).

Figure 3:
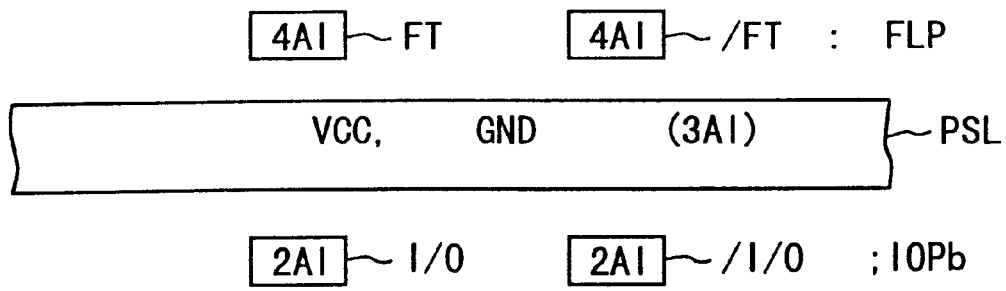
FIG. 3 schematically shows arrangement of an internal data line and a feed-through line of FIG. 1.

FIG. 3 schematically shows the interconnection layout in memory sub array MAB1 of FIG. 2. Feed-through lines FT and /FT are formed of, for example, a fourth level aluminum interconnection line (4Al). Internal data lines I/O and /I/O of internal data line pair IOPb are formed of the second level aluminum interconnection line (A 2Al power supply line PSL fixed to power supply voltage VCC or ground voltage GND and formed of the third level aluminum interconnection line (3Al) are provided between feed-through lines FT and /FT and internal data lines I/O and /I/O. Power supply line PSL having its voltage fixed functions as an electrostatic shield layer between feed-through lines FT and /FT and internal data lines I/O and /I/O to prevent noise caused by capacitive coupling from being generated between feed-through lines FT and /FT and internal data lines I/O and /I/O. Therefore, internal read data of small amplitude can be properly transmitted in a data readout operation.

Figure 4:
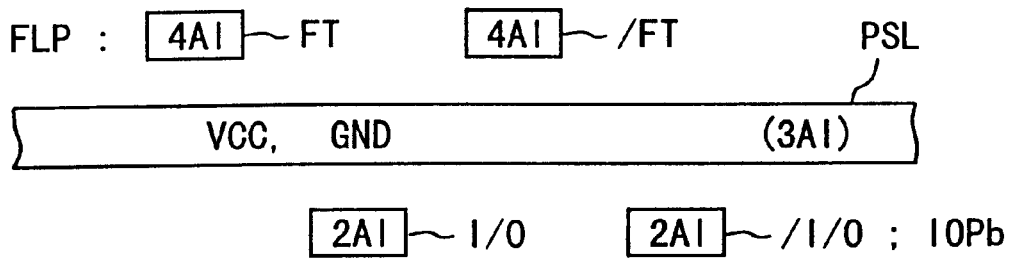
FIG. 4 shows a modification of the arrangement of an internal data line and a feed-through line of FIG. 1.

FIG. 4 shows another example of the interconnection layout in memory sub array MAB1. In the previous arrangement of FIG. 3, feed-through lines FT and /FT are arranged to align in a direction perpendicular to internal data lines I/O and /I/O of internal data line pair IOPb. In the arrangement of FIG. 4, internal data lines I/O and /I/O and feed-through lines FT and /FT are arranged shifted in position with each other (arranged avoiding overlapping when viewed in plan or layout). The arrangement shown in FIG. 4 similarly provides the advantage of preventing noise generation caused by capacitive coupling by virtue of power supply line PSL formed of the third level aluminum interconnection layer (3Al) functioning as an electrostatic shield layer.

[Modification]

Figure 5:
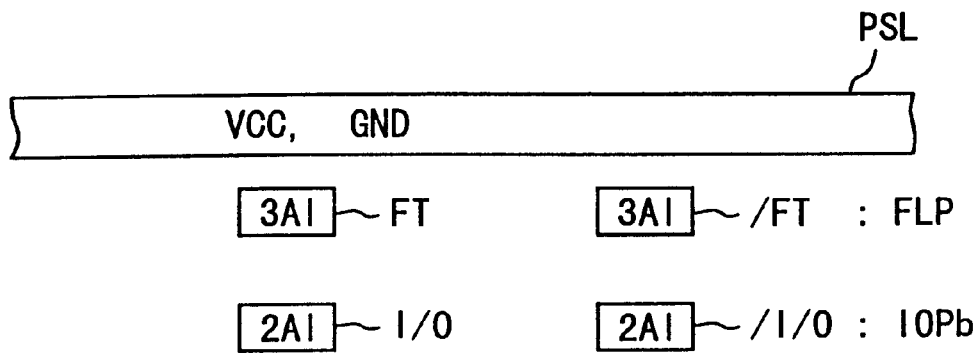
FIG. 5 shows a further modification of an internal data line and a feed-through line of FIG. 1.

FIG. 5 schematically shows a structure of modification 1 of the first embodiment of the present invention. In FIG. 5, the interconnection layout of memory sub array MAB1 arranged in close proximity to read/write circuit 1 of FIGS. 1 and 2 is depicted schematically. Referring to the layout of FIG. 5, internal data lines I/O and /I/O of internal data line pair IOPb are formed of the second level aluminum interconnection line (2Al). Feed-through lines FT and /FT of feed-through line pair FLP are formed of the third level aluminum interconnection lines (3Al) that are upper than the layer of internal data lines I/O and /I/O. Power supply line PSL is arranged above feed-through lines FT and /FT. Power supply line PSL is formed of, for example, the fourth level aluminum interconnection.

In the arrangement of FIG. 5, internal data lines I/O and /I/O and feed-through lines FT and /FT are formed at different interconnection layers. Therefore, the arrangement of feed-through lines FT and /FT will not affect the pitch condition of internal data lines I/O and /I/O. The arrangement of FIG. 5 provides the advantage that electromagnetic radiation noise caused by a high frequency signal during high speed transfer of internal data on feed-through lines FT and /FT is prevented by virtue of power supply line PSL serving as a shield layer.

In the layout of FIG. 5, feed-through lines FT and /FT and internal data lines I/O and /I/O may be arranged avoiding overlapping when viewed in a planar layout, as shown in FIG. 4.

Figure 6:
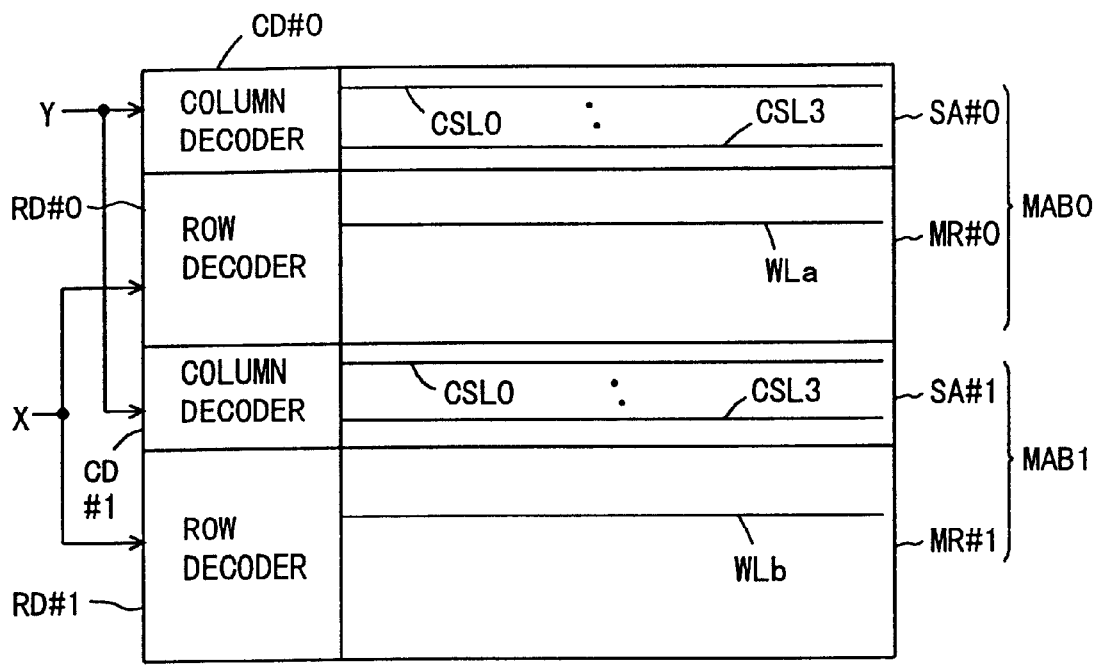
FIG. 6 schematically shows arrangement of row and column decoders of the semiconductor memory device of FIG. 1.

FIG. 6 schematically shows a structure of the memory cell select circuitry of semiconductor memory device of the first embodiment. Referring to FIG. 6, memory sub array MAB0 includes sense amplifier band SA#0 in which sense amplifier circuits are arranged, and a memory cell region MR#0 in which memory cells are arranged in rows and columns. Memory sub array MAB1 includes a memory cell region MR#1 in which memory cells are arranged in rows and columns, and a sense amplifier band SA#1 including a sense amplifier circuit arranged corresponding to each column of memory cell region MR#1.

Row decoders RD#0 and RD#1 are provided corresponding to memory cell regions MR#0 and MR#1, and decode a row address signal X to drive a word line arranged corresponding to an addressed row to a selected state. Column decoders CD#0 and CD#1 are provided corresponding to respective sense amplifier bands SA#0 and SA#1, and decode a column address signal Y to transmit a column select signal on column select lines CSL0–CSL3.

Row decoders RD#0 and RD#1 decode row address signal X to drive the word lines (WLa and WLb) in corresponding memory cell regions MR#0 and MR#1 to a selected state simultaneously.

Column decoders CD#0 and CD#1 operate in parallel to decode column address signal Y to drive one of column select lines CSL0–CSL3 arranged in corresponding sense amplifier bands SA#0 and SA#1 to a selected state.

According to the structure of FIG. 6, a row select operation and a column select operation can be carried out at the same time in memory sub arrays MAB0 and MAB1. ¼ of the sense amplifier circuits can be coupled to the internal data line pairs in each of sense amplifier bands SA#0 and SA#1.

[Modification of Array Structure]

Figure 7:
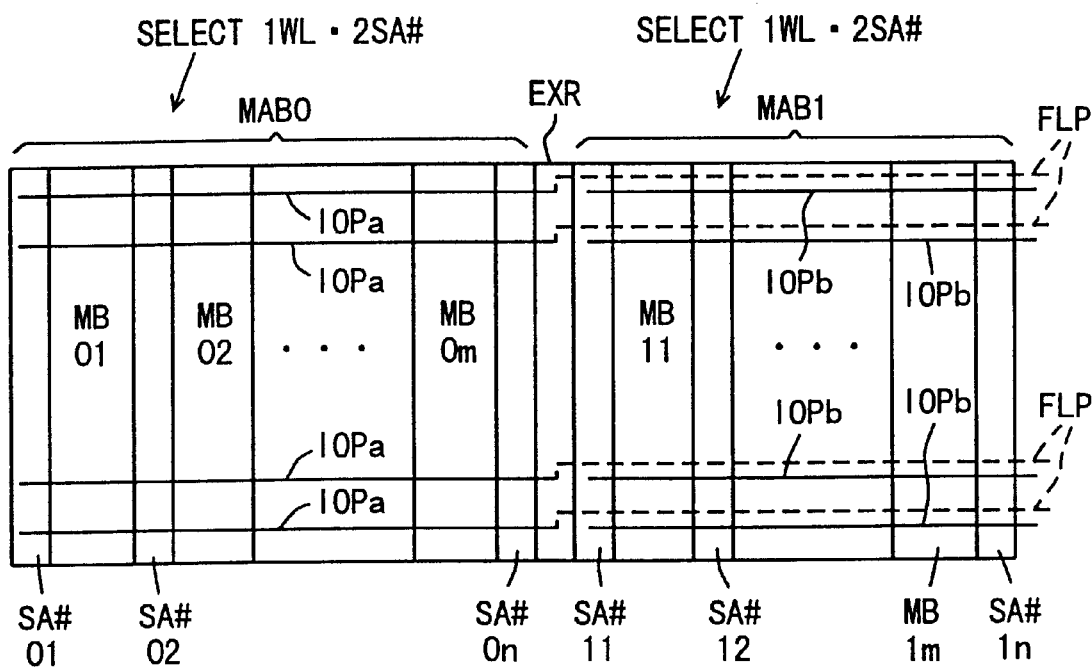
FIG. 7 schematically shows a structure of a modification of the semiconductor memory device according to the first embodiment of the present invention.

FIG. 7 schematically shows a modification of the array portion of the semiconductor memory device of the first embodiment. In FIG. 7, memory sub array MAB0 is divided into a plurality of memory blocks MB01–MB0m. Also, memory sub array MAB1 is divided into a plurality of memory blocks MB11–MB1m. Sense amplifier bands SA#01–SA#0n are arranged corresponding to memory blocks MB01–MB0m. Sense amplifier bands SA#11–SA#1n are arranged corresponding to memory blocks MB11–MB1m.

A line exchange region EXR is provided between memory sub arrays MAB0 and MAB1.

An internal data line pair IOPa is provided extending in the column direction and common to memory blocks MB01–MB0m of memory sub array MAB0. An internal data line pair IOPb is arranged extending in the column direction and common to memory blocks MB11–MB1m of memory sub array MAB1.

In line exchange region EXR, internal data line pair IOPa is electrically connected to feed-through line pair FLP located at an upper layer than internal data line pair IOPb. Feed-through line pair FLP is arranged extending in the column direction parallel to internal data line pair IOPb.

According to the arrangement of FIG. 7, in each of memory sub arrays MAB0 and MAB1one word line (WL) is selected in one memory block, and a sense amplifier band (sense amplifier bands at both sides of the selected memory block) provided corresponding to the selected memory block is selected.

In the arrangement shown in FIG. 7, a shared sense amplifier structure in which a sense amplifier band is shared between adjacent memory blocks is employed. In this shared sense amplifier structure, one internal data line pair is arranged for four sense amplifier circuits at each side of the selected memory block. Therefore, one pair of internal data line pairs is arranged for four sense amplifier circuits in the total of the sense amplifier bands located at both sides. This is because internal data line pairs IOPa and IOPb are arranged extending in the column direction and common to plurality of memory blocks MB01–MB0m and MB11–MBm, and a sense amplifier circuit is arranged alternately with respect to the column direction.

By selecting a plurality of columns plurality of sense amplifier circuits) simultaneously in memory sub arrays MAB0 and MAB1 in the arrangement of FIG. 7, data of the bit width of half the number of sense amplifier circuits in the sense amplifier bands provided for one memory block can be transferred, similar to the structure shown in FIG. 2.

Sense amplifier bands SA#0n and SA#11 are provided at both sides of line exchange region EXR in order to allow simultaneous selection of memory blocks MB0m and MB11.

The array arrangement in memory sub arrays MAB0 and MAB1 is identical. By librarizing the optimum design of one memory block and the sense amplifier bands located at both sides thereof, and repeatedly arranging the macro block library, the storage capacity of the semiconductor memory device can be increased easily.

By providing sense amplifier bands SA#0n and SA#11, a selected sense amplifier circuit in memory sub array MAB0 can be connected to internal data line pair IOPa while a selected sense amplifier circuit in memory sub array MAB1 can be connected to internal data line pair IOPb.

According to the first embodiment of the present invention, the internal data line pair provided in one of two memory sub arrays is connected to the feed-through line pair arranged over the other memory sub array in an upper layer than the internal data line pair. Therefore, the number of sense amplifier circuits that can be selected at one time can be increased without adversely affecting the pitch condition of the internal data line pairs. Thus, the internal data transfer rate can be improved significantly.

Second Embodiment

Figure 8:
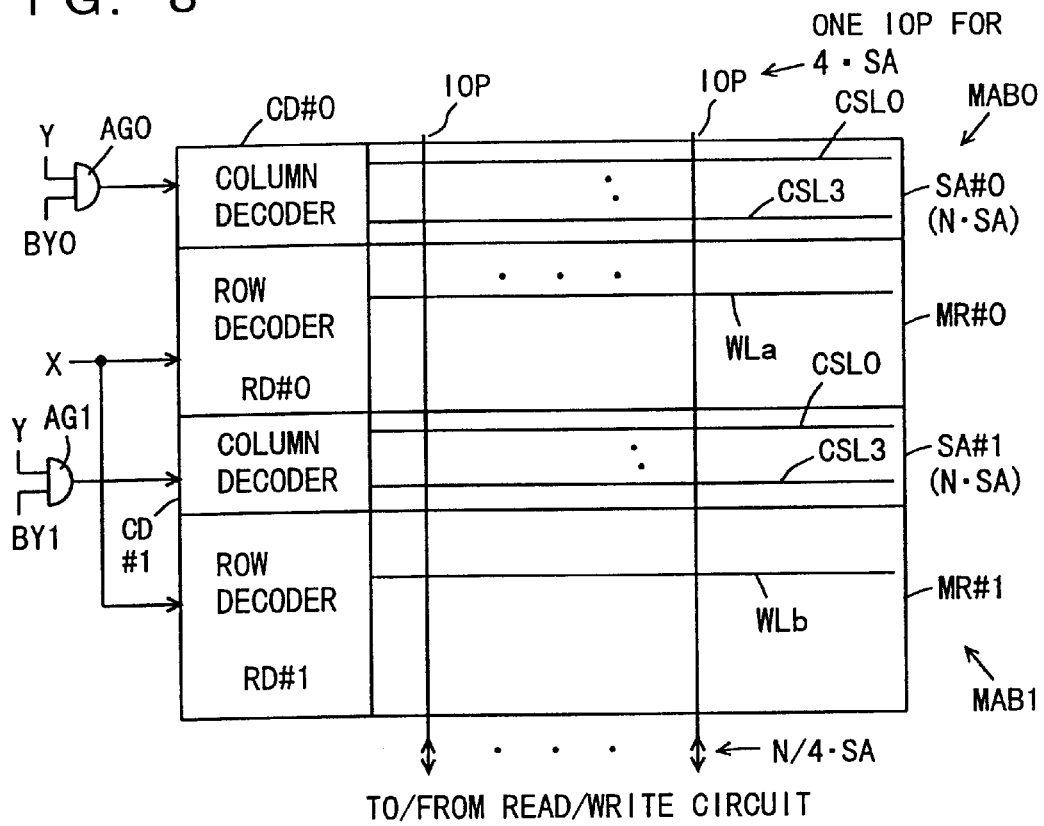
FIG. 8 schematically shows a structure of an array portion of a semiconductor memory device according to a second embodiment of the present invention.

FIG. 8 schematically shows a structure of a main part in a semiconductor memory device according to the second embodiment of the present invention. In FIG. 8, the memory array is divided into two memory sub blocks MR#0 and MR#1. Memory cells are arranged in rows and columns in memory sub blocks MR#0 and MR#1. A word line WL (WLa, WLb) is arranged corresponding to each row.

Sense amplifier bands SA#0 and SA#1 are arranged corresponding to memory sub blocks MR#0 and MR#1. Each of sense amplifier bands SA#0 and SA#1 includes N sense amplifier circuits SA.

Sense amplifier band SA#0 and memory sub block MR#0 form memory sub array MAB0. Sense amplifier band SA#1 and memory sub block MR#1 form a memory sub array MAB1.

An internal data line pair IOP is arranged extending along the column direction on memory sub arrays MAB0 and MAB1. This internal data line pair IOP is provided corresponding to four sense amplifier circuits in each of sense amplifier bands SA#0 and SA#1, similar to the previous first embodiment. Internal data line pair IOP provided common to memory sub arrays MAB0 and MAB1 is coupled to a read/write circuit not shown.

Column decoders CD#0 and CD#1 are provided corresponding to sense amplifier bands SA#0 and SA#1 to drive column select lines CSL0–CSL3. Row decoders RD#0 and RD#1 are provided corresponding to memory sub blocks MR#0 and MR#1.

The output signal of an AND circuit AG0 receiving column address signal Y and column block address signal BY0 is applied to column decoder CD#0. The output signal of an AND circuit AG1 receiving column address signal Y and column block address signal BY1 is applied to column decoder CD#1. A row address signal X is applied common to row decoders RD#0 and RD#1.

Column block address signals BY0 and BY1 specify memory sub arrays MAB0 and MAB1, respectively. Column address signal Y and column block address signal BY are provided simultaneously, whereby the column decoder corresponding to the memory sub array specified by column block address signal BY executes a column select operation. Row decoders RD#0 and RD#1 receive, in common, column address signal X to drive the word line (WLa, WLb) to a selected state. More specifically, following the drive of word lines WLa and WLb to a selected state simultaneously in memory sub blocks MR#0 and MR#1 by row decoders RD#0 and RD#1, either column decoder CD#0 or CD#1 is set to a selected state by column block address signal BY. Therefore, the number of data that can be accessed simultaneously in the page mode, i.e., the page size, can be set to N/2. The operation of the semiconductor memory device of FIG. 8 will now be described with reference to the timing chart of FIG. 9.

Figure 9:
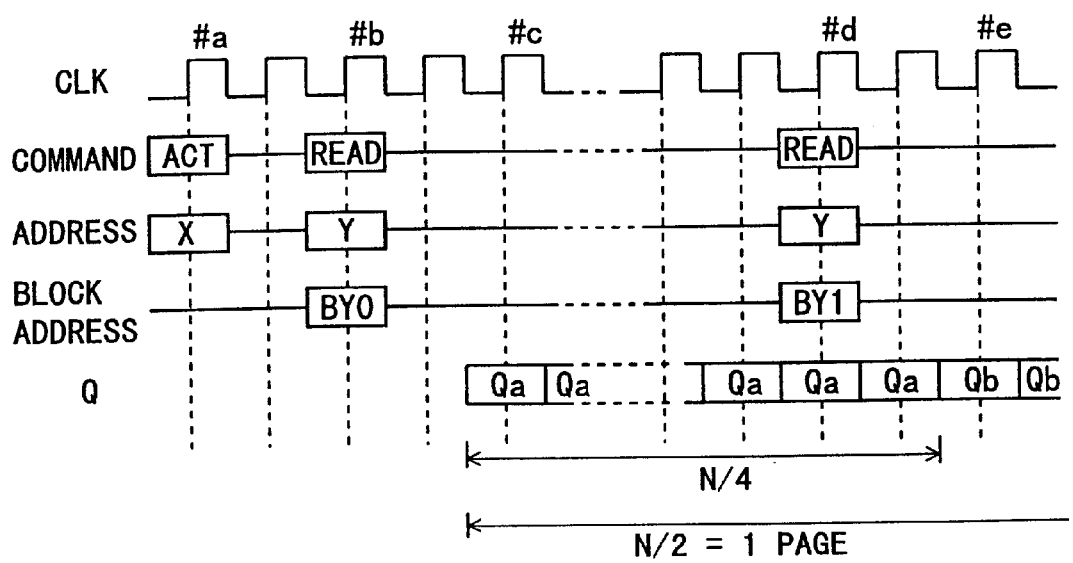
FIG. 9 is a timing chart representing a data readout operation of the semiconductor memory device of FIG. 8.

The operation of a clock synchronous type semiconductor memory device that operates in synchronization with a clock signal CLK is exemplified in FIG. 9, or the operation is made when data read out on internal data line pair IOP is output one bit at a time in synchronization with clock signal CLK sequentially in a data readout mode.

At clock cycle #a, a command ACT instructing row access (row selection) is applied. At the same time, row address signal X specifying a row is applied. In response to command ACT, row decoders RD#0 and RD#1 are rendered active to decode the applied address signal X and drive word line WL (WLa and WLb) to a selected state simultaneously in corresponding memory sub blocks MR#0 and MR#1.

Following the drive of the word line to a selected state, sense amplifier circuit SA in sense amplifier bands SA#0 and SA#1 carries out a sense operation, whereby the data in the memory cell connected to the selected word line is latched by each sense amplifier circuit.

At clock cycle #b, a read command READ instructing data readout is applied. At the same time, column address signal Y specifying a column and column block address signal BY specifying a memory sub block are applied. At clock cycle #b, column block address signal BY0 is applied. Column decoder CD#0 is rendered active to carry out a select operation, and one of column select lines CSL0–CSL3 is driven to a selected state.

N/4 sense amplifier circuits out of the N sense amplifier circuits in sense amplifier band SA#0 are coupled in parallel to internal data line pairs IOP. The data on the N/4 internal data line pairs IOP are amplified by the preamplifiers in the read/write circuit, and then read out sequentially in synchronization with CLK via a transfer circuit not shown. When the column latency is 2, valid data Qa is output at an elapse of two clock cycles after read command READ is applied.

During the period of N/4 clock cycles starting from clock cycle #c, the data latched by the sense amplifier circuits in sense amplifier band SA#0 and amplified by the preamplifiers are sequentially read out.

At a clock cycle preceding by one clock cycle the clock cycle when all the memory cell data has been readout from sense amplifier band SA#0, i.e., at clock cycle #d, read command READ is applied again. At the same time, column address signal Y and column block address signal BY are also applied. This column address signal Y may be the same signal, or different signal. FIG. 9 shows the case where an address signal Y identical to that at clock cycle #b is applied again at clock cycle #d. The column block address signal applied at clock cycle #d is set to column block address signal BY1 that specifies memory sub array MAB1. Under this state, column decoder CD#1 is rendered active, whereby N/4 sense amplifier circuits out of the N sense amplifier circuits in sense amplifier band SA#1 are selected and connected to internal data line pair IOP. Since the column latency is 2, the data of the memory cells selected by read command READ of clock cycle #d (the data latched by the sense amplifier circuits) are sequentially output from clock cycle #e. Data Qa from memory sub block MR#0 and memory cell data Qb from memory sub block MR#1 can be output successively to increase the page size.

In the data output operation of FIG. 9, the data latched in the sense amplifier circuit are sequentially output in synchronization with clock signal CLK. However, data Q can be output in synchronization with both the rising edge and falling edge of clock signal CLK (in the case of a clock synchronous type semiconductor device of double data rate).

By sequentially updating column address signal Y to sequentially drive column select lines CSL0–CSL3 to a selected state in one memory sub array when read command READ is applied, the page size can be set to 2·N bits at maximum. More specifically, the sense amplifier circuits in sense amplifier band SA#0 are sequentially selected in the page mode (sequentially select column select lines CSL0–CSL3, and then drive column select lines CSL0–CSL3 in sense amplifier band SA#1 sequentially to a selected state). Accordingly, the page size can be increased. Data can be transferred at high speed without need to stop data transfer in switching the page.

In FIG. 9, the data of the sense amplifier circuit is output in synchronization with clock signal CLK, and the data of the sense amplifier circuits selected by one column select line are sequentially output over the N/4 clock cycles. In the case of a logic-merged memory, the data on internal data line pair IOP can be transferred in parallel in synchronization with the clock signal at the same time since the data bus width between the logic and the memory is wide enough. In this case, the data of internal data line pairs IOP are read out in parallel at clock cycle #c according to the timing chart of FIG. 9. When the column latency is 2, the page size can be set to N/2 bits by applying a read command again at the clock cycle succeeding clock cycle #b. For the sake of increasing the page size, the sequence in which data of the sense amplifier circuits are sequentially output in synchronization with the clock signal is shown in FIG. 9.

The data read out in parallel on internal data line pairs IOP can be selected in the unit of a predetermined number of bits by an internal transfer circuit not shown, so that data transfer is effected every predetermined number of bits.

In the second embodiment, a plurality of word lines are driven to a selected state simultaneously in memory sub arrays, and data of the memory cells connected to these word lines are sequentially accessed in the page mode to realize high speed readout. The external data transfer bit rate is to be determined appropriately according to the application.

[Modification]

Figure 10:
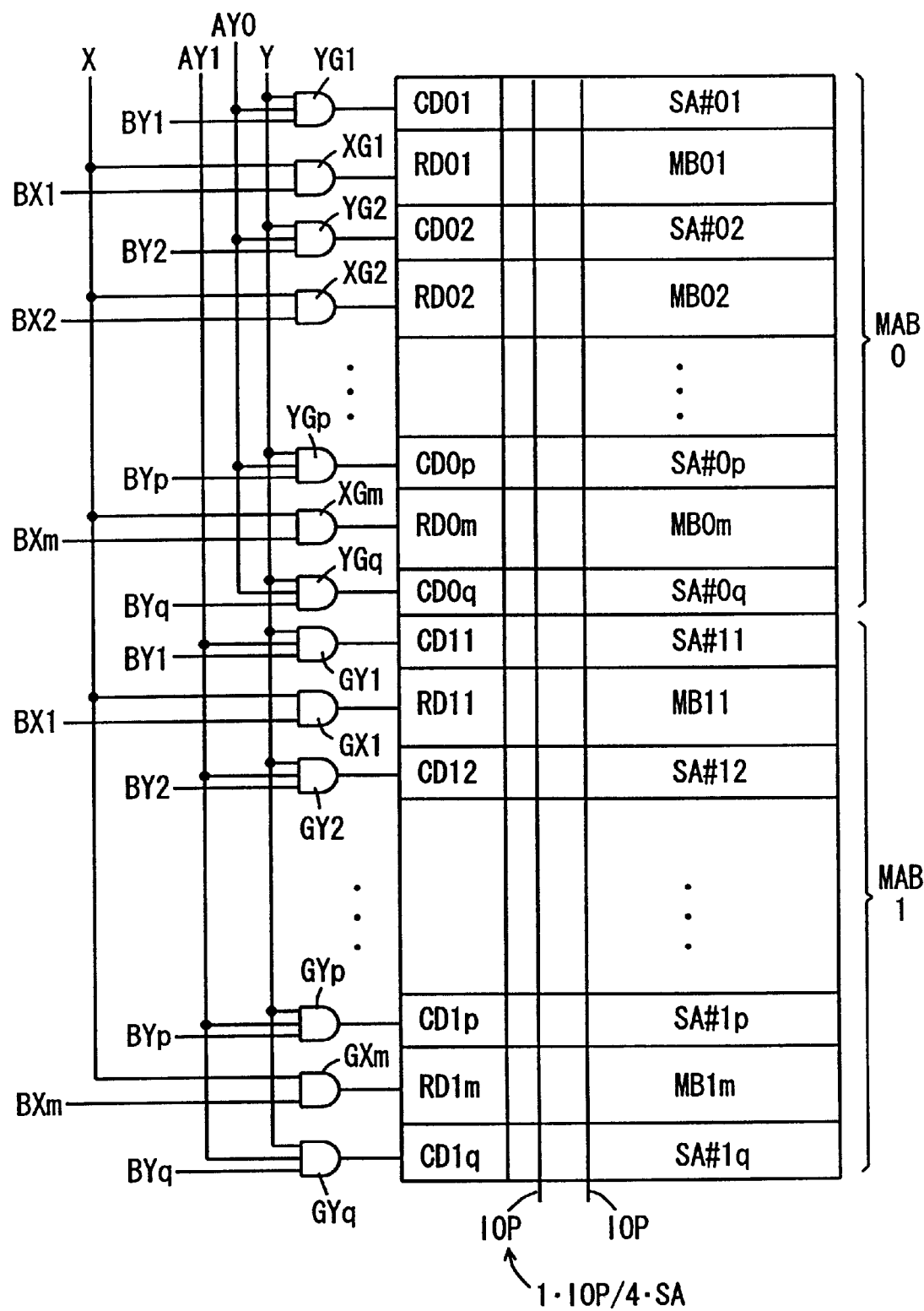
FIG. 10 schematically shows a structure of the array portion of a modification of the second embodiment.

FIG. 10 schematically shows a modification of the second embodiment. In FIG. 10, the memory array is divided into two memory sub arrays MAB0 and MAB1. Memory sub array MAB0 includes a plurality of memory blocks MB01–MB0m. Memory sub array MAB1 includes memory blocks MB11–MB1m.

Sense amplifier bands SA#01–SA#0q are arranged corresponding to memory blocks MB01–MB0m. Sense amplifier bands SA#11–SA#1q are arranged corresponding to memory blocks MB11–MB1m. Memory cells are arranged in rows and columns in each of memory blocks MB01–MB0m and MB11–MB1m. Sense amplifier circuits corresponding to columns of corresponding memory blocks are arranged in sense amplifier bands SA#01–SA#0q and SA#11–SA#1q. Sense amplifier bands SA#01–SA#0q and SA#11–SA#1q have a shared sense amplifier structure. It is to be noted that only memory blocks MB0m and MB11 sense amplifier bands SA#0q and SA#11, respectively.

Internal data line pair IOP extending in the column direction is arranged common to memory sub arrays MAB0 and MAB1. One internal data line pair IOP is arranged corresponding to four sense amplifier circuits in each sense amplifier band.

Column decoders CD01–CD0q are arranged corresponding to sense amplifier bands SA#01–SA#0q. Column decoders CD11–CD1q are arranged corresponding to sense amplifier bands SA#11–SA#1q. Row decoders RD01–RD0m are arranged corresponding to memory blocks MB01–MB0m. Row decoders RD11–RD1m are arranged corresponding to memory blocks MB11–MB1m.

In order to render column decoders CD01–CD0q selectively active, AND circuits YG1–YGq are provided. Similarly, AND circuits GY1 . GYq are arranged corresponding to column decoders CD11–CD1q. AND circuits XG1–XGm are arranged corresponding to row decoders RD01–RD0m. AND circuits GX1–GXm are arranged corresponding to row decoders RD11-RD1m.

Row address signal X and block specify signal BXi are applied to AND circuit XGi (i=1–m). In response to block specify signal BXi driven to a selected state, corresponding AND circuit XGi is enabled, and row address signal X is applied to a corresponding row decoder RD0i.

Row address signal X and block specify signal BXi are also applied to AND circuit GXi. AND circuit GXi is enabled when corresponding block specify signal BXi is selected, and row address signal X is transmitted to corresponding row decoder RD1i.

In memory sub arrays MAB0 and MAB1, row decoders RD0i and RD1i provided corresponding to memory blocks MB0i and MB1i specified by block specify signal BXi are rendered active to drive the word lines to a selected state. Accordingly, one memory block is driven to a selected state in each of memory sub arrays MAB0 and MAB1.

AND circuit YGj (j=1–q) receives column address signal Y, sub array specify signal AY0 and block specify signal BYj. Sub array specify signal AY0 specifies memory sub array MAB0. AND circuit YGj is enabled when both memory sub array specify signal AY0 and corresponding block specify signal BYj are selected, and column address signal Y is applied to corresponding column decoder CD0J. Since the shared sense amplifier structure is employed, two column block specify signals BYj and BYj+1 are driven to a selected state at the same time in memory sub array MAB0.

AND circuit GYj provided corresponding to memory sub array MAB1 receives sub array specify signal AY1, block specify signal BYj and column address signal Y. When sub array specify signal AY1 and block specify signal BYj are both selected, AND circuit GYj applies column address signal Y to a corresponding column decoder CD1j to effect a column select operation. Similarly in memory sub array MAB1, two block specify signals BYj and BYj+1 are driven to a selected state at the same time since the shared sense amplifier structure is employed.

When row access command ACT is applied in the structure of FIG. 10, one memory block in each of memory sub arrays MAB0 and MAB1 is driven to a selected state. Then, when a read command is applied, a memory sub array specify address and a memory block specify address are applied together with column address signal Y at the same time. Accordingly, either memory sub array MAB0 or MAB1 is selected according to sub array specify signals AY0 and AY1 generated by the memory sub array specify address. In the selected memory sub array MAB (MAB0 or MAB1), the sense amplifier bands provided corresponding to one memory block are selected according to block specify signal BY generated by the memory block specify address. When access in the page mode is completed corresponding to a read command in one memory sub array, a read command specifying the remaining memory sub array is applied to read out data successively.

Similarly in the structure of FIG. 10, two word lines are driven to a selected state at the same time, and then two word lines selected at the same time are sequentially accessed by the next column access command (read command or write command), so that the page size can be set to N/2 bits.

In the structure of FIG. 10, column address signal Y can be sequentially modified with respect to the selected word line in one of the memory sub arrays MAB0 and MAB1 to sequentially read out data of the memory cells connected to one word line.

According to the second embodiment of the present invention, a plurality of word lines are driven to a selected state simultaneously, and an address signal specifying a memory block is applied at the same time in column access to carry out column selection in one memory block. Therefore, the page size can be increased without modifying the pitch of the internal data line pair. Thus, data can be transferred at high speed (since there is no overhead in page switching).

Third Embodiment

Figure 11:
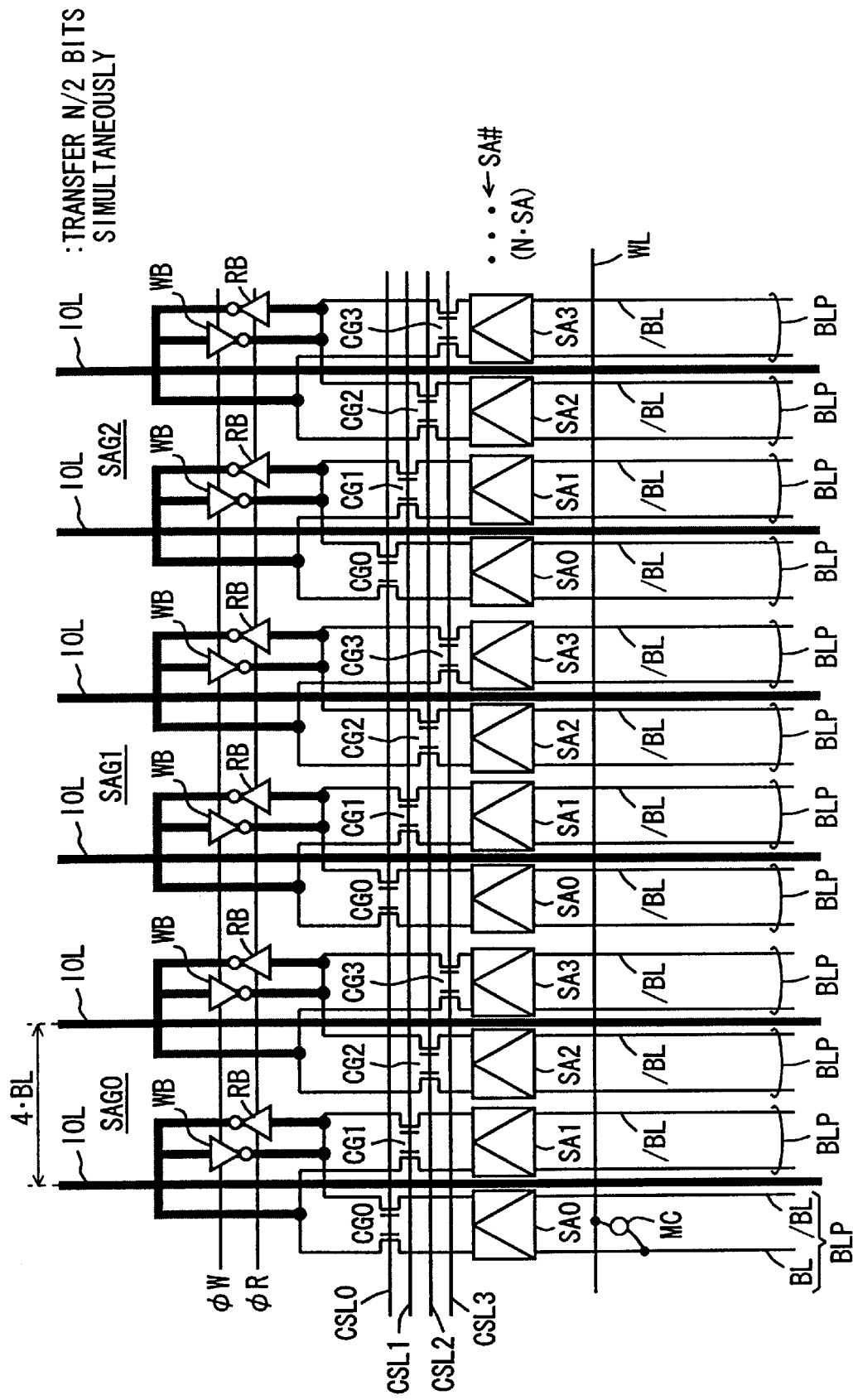
FIG. 11 schematically shows a structure of a main part of a semiconductor memory device according to a third embodiment of the present invention.

FIG. 11 schematically shows a structure of a main part of a semiconductor memory device according to a third embodiment of the present invention. FIG. 11 shows a structure of the portion related to one sense amplifier band SA#.

Referring to FIG. 11, sense amplifier band SA# includes a sense amplifier circuit SA (SA0–SA3) provided corresponding to bit line pair BLP, and column select gates CG0–CG3 provided corresponding to sense amplifier circuits SA0–SA3, respectively, any rendered conductive in response to a signal on column select lines CSL0–CSL3. Four sense amplifier circuits SA0–SA3 form one sense amplifier group SAG. In FIG. 11, three sense amplifier groups SAG0–SAG2 are shown representatively.

One internal data line IOL is arranged corresponding to two sense amplifier circuits. Internal data line IOL is one signal line (single end signal line) to transfer a data signal of one bit. Corresponding to internal data line IOL are provided a write inverter buffer WB activated in response to activation of a write designation signal $\phi W$ to invert a signal on a corresponding internal data line IOL, and a read inverter buffer RB activated in response to activation of a read operation designation signal $\phi R$ to invert the data signal transmitted via column select gate CG (any of CG0–CG3) to transmit the inverted data signal to internal data line IOL. Write inverter buffer WB and read inverter buffer RB are coupled to bit line /BL via column select gate CG.

A memory cell MC is arranged at the crossing between word line WL and bit line pair BLP. Complementary data signals are transmitted on bit lines BL and /BL to be amplified and latched by a corresponding sense amplifier circuit SA (SA0–SA3). By inverting the write data on single end internal data line IOL by write inverter buffer RB, write data signals complementary to each other can be transmitted to bit lines BL and /BL of selected bit line pair BLP. In a data readout operation, read inverter buffer RB inverts the data signal latched by the sense amplifier circuit on complementary bit line /BL, so that a signal of the same logic level is transmitted on single end internal data line IOL. Therefore, a signal corresponding to memory cell data can be properly transmitted on internal data line IOL.

In the arrangement of FIG. 11, one internal data line IOL is arranged corresponding to two sense amplifier circuits in one sense amplifier band. Therefore, the pitch condition of internal data line IOL is equal to the pitch of the four bit lines. Therefore, data bit of ½ the number of sense amplifier circuits N in sense amplifier band SA# can be transferred at the same time without aggravating the pitch condition.

The structure of the memory sub array is arbitrary. The structure of the memory array shown in FIG. 8 or 10 can be employed.

[Modification]

Figure 12:
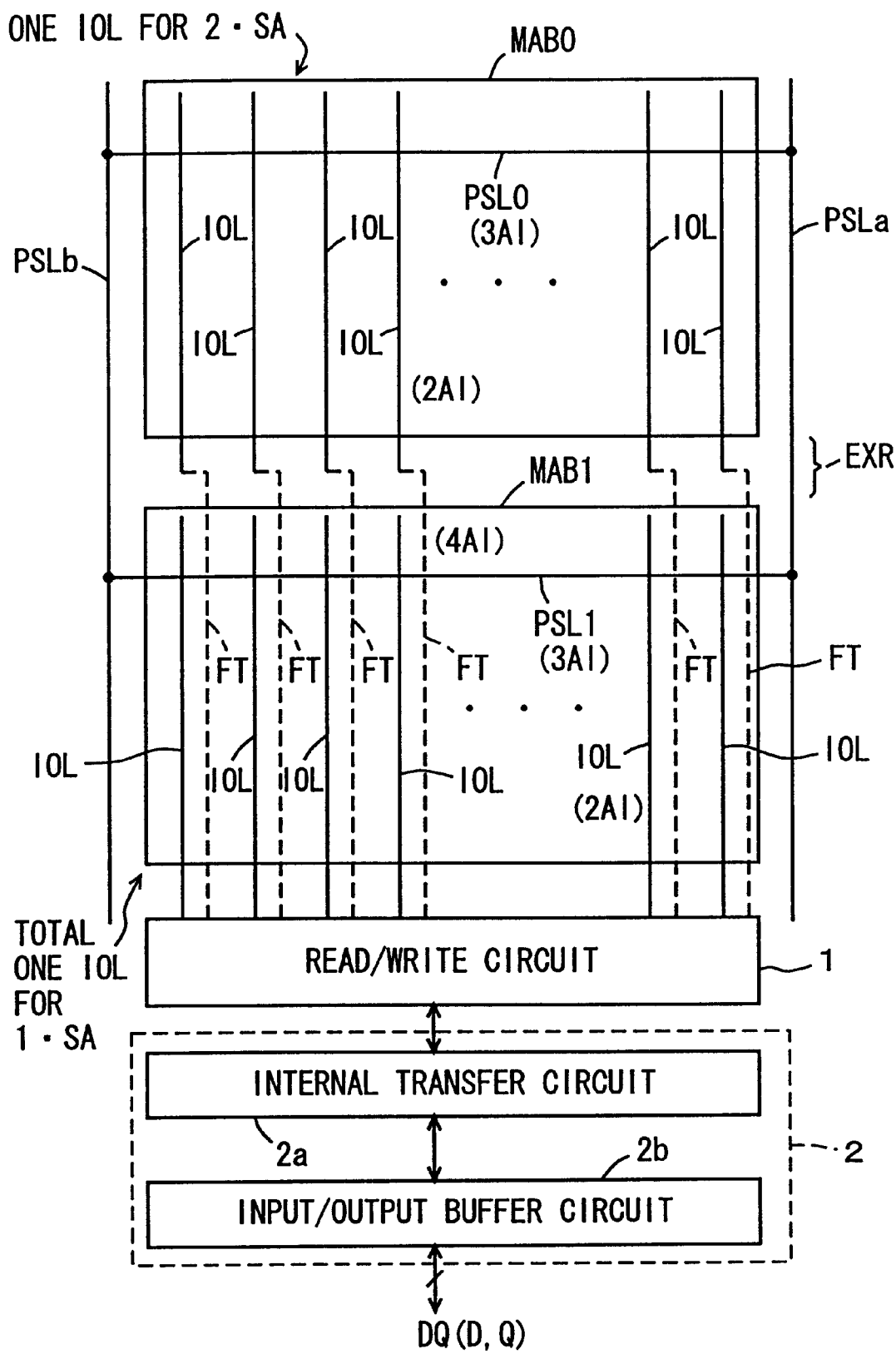
FIG. 12 schematically shows a structure of a modification of the third embodiment.

FIG. 12 schematically shows a structure of a modification of the third embodiment of the present invention. The semiconductor memory device of FIG. 12 differs from the semiconductor memory device of the first embodiment shown in FIG. 1 in the following points.

In each of memory sub arrays MAB0 and MAB1, one single end internal data line IOL is arranged corresponding to two sense amplifier circuits (2·SA) in one sense amplifier band. In line exchange region EXR between memory sub arrays MAB0 and MAB1, single end internal data line IOL provided for memory sub array MAB0 is connected to an upper feed-through line FT.

Internal data line IOL is formed of, for example, the second level aluminum interconnection line (2Al). Feed-through line FT is formed of, for example, the fourth level aluminum interconnection line (4Al). Sense amplifier power supply lines PSL0 and PSL1 arranged extending in the row direction are formed of the third level aluminum interconnection line (3Al) between feed-through line FT and internal data line IOL. The remaining structure is identical to that of FIG. 1, and corresponding components have the same reference characters allotted.

In the arrangement shown in FIG. 12, the internal data line IOL has a single end structure, and one internal data line IOL is provided for two sense amplifier circuits in one sense amplifier band. Internal data line IOL on memory sub array MAB0 is coupled to read/write circuit 1 via feed-through line FT. Internal data line IOL of memory sub array MAB1 is coupled to read/write circuit 1 parallel to these feed-through lines FT. Viewed from the read/write circuit 1, one internal data line is equivalently provided for one sense amplifier circuit in one sense amplifier band. Data bits identical in number to the N of sense amplifier circuits included in one sense amplifier band can be transferred at the same time. Therefore, the data transfer rate can be further improved.

In the arrangement shown in FIG. 12, feed-through line FT can be formed of the third level aluminum interconnection line, and sense amplifier power supply lines PSL0 and PSL1 can be provided in an interconnection layer of an upper layer (refer to FIG. 5).

The preamplifier in read/write circuit 1 is required to amplify a data signal of a small amplitude. When a single end internal data line IOL is employed, a data signal of a small amplitude transmitted via the single end internal data line can be amplified sufficiently by using an inverter that has the input logic threshold value set to a high level (internal data line is Vcc precharged), or by using a differential amplifier that compares a reference voltage with the signal on internal data line IOL as the preamplifier circuit. A latch circuit is provided at a succeeding stage of this preamplifier. The data signal held in this latch circuit is internally transferred to be provided outside in synchronization with the clock signal. The write driver can be formed of a general buffer circuit.

According to the third embodiment of the present invention, the number of internal data lines can be increased without modifying the pitch condition since an internal data line of a single end structure is employed. The bus width of the internal data bus can be increased to realize high speed data transfer.

The third embodiment can be employed in combination with the second embodiment (the page size can be further increased).

Fourth Embodiment

Figure 13:
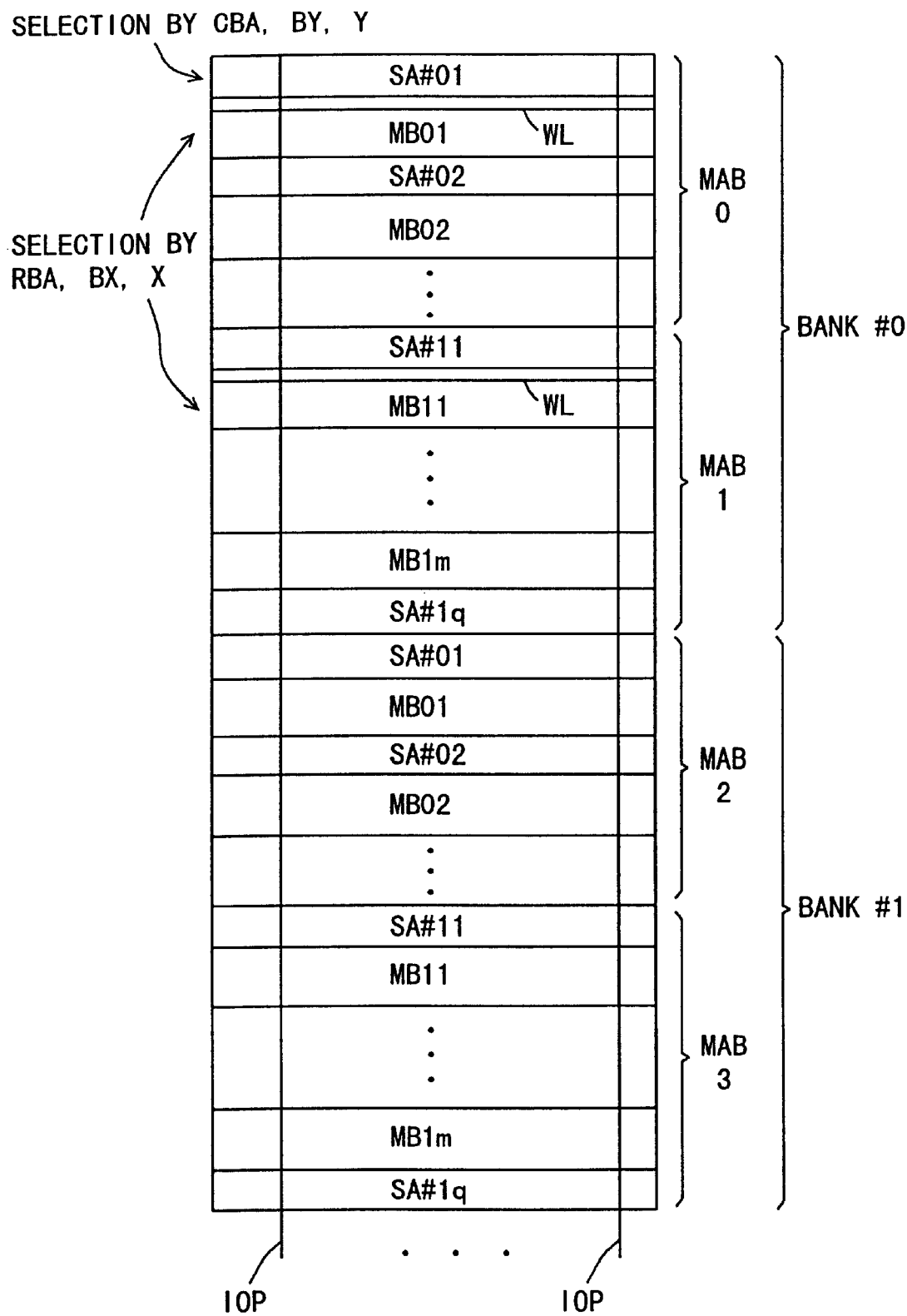
FIG. 13 schematically shows a structure of an array portion of a semiconductor memory device according to a fourth embodiment of the present invention.

FIG. 13 schematically shows a structure of a memory array portion of a semiconductor memory device according to a fourth embodiment of the present invention. In FIG. 13, the memory array is divided into four memory sub arrays MAB0–MAB3. Memory sub arrays MAB0 and MAB1 form bank #0. Memory sub array MAB2 and MAB3 form bank #1. In these banks #0 and #1, memory cell rows can be driven to a selected state independent of each other.

Memory sub array MAB0 includes memory blocks MB01, . . . and sense amplifier group SA#01, . . . . Memory sub array MAB1 includes sense amplifier bands SA#11–SA#1q and memory blocks MB11–MB1m. Memory sub array MAB2 includes sense amplifier bands SA#01, . . . and memory blocks MB01, . . . . Memory sub array MAB3 includes sense amplifier bands SA#11–SA#1q, and memory blocks MB11–MB1m.

Upon application of a row access command (array activation command ACT), row bank address RBA and block address are applied simultaneously. Two memory blocks are specified according to block address signal in the bank specified by row bank address RBA. In the specified memory block, word line WL corresponding to the addressed row according to row address signal X is driven to a selected state. When a column access command (read command or write command) is applied, column bank address signal CBA, column block address signal BY specifying a memory block, and a column address signal Y for column specification are applied at the same time. The column select lines in the sense amplifier bands related to one memory block is driven to a selected state. Here, the state is envisaged in which the sense amplifiers are formed of the shared sense amplifier arrangement.

When bank #0 is specified by row bank address signal RBA in the application of a row access command, two memory blocks (MB01 and MB11) are specified according to block address signal BX in each of memory sub arrays MAB0 and MAB1. A word line WL is driven to a selected state according to row address signal X in memory blocks MB01 and MB11. Then, when memory block MB01 is to be accessed in column access, block address signal BY specifies one memory block MB01. A column is selected according to column address signal Y in sense amplifier bands SA#01 and SA#02 provided corresponding to memory block MB01. The sense amplifier circuits corresponding to this selected column are connected to internal data line pairs IOP.

Internal data line pair IOP is arranged common to the memory blocks of banks #0 and #1. By driving a plurality of word lines to a selected state at the same time in one bank in the case of a bank configuration and sequentially accessing the word line of a selected state by column access, the page size can be increased. Here, one internal data line pair IOP is arranged per four sense amplifier circuits in one sense amplifier band.

The structure of the portion related to bank #0 of FIG. 13 will be described in further detail with reference to FIG. 14. Bank #1 has a similar structure.

Figure 14:
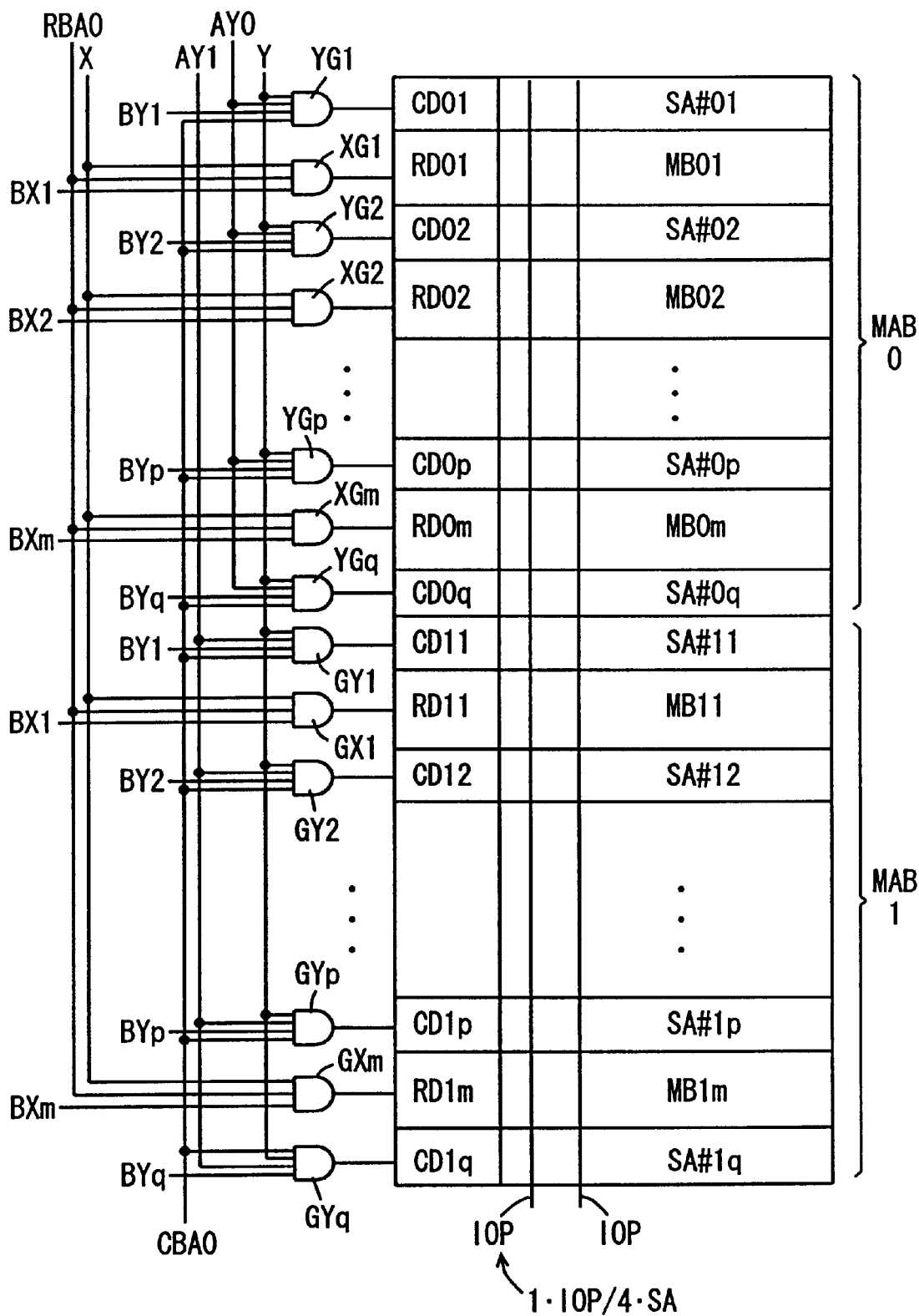
FIG. 14 shows in detail the structure of a memory array of FIG. 13.

In FIG. 14, memory sub array MAB0 includes memory blocks MB01–MB0m and sense amplifier bands SA#01–SA#0q. Memory sub array MAB1 includes memory blocks MB11–MB1m and sense amplifier bands SA#11–SA#1q. Internal data line pair IOP is arranged in common extending in the column direction on these memory blocks and sense amplifier bands. One internal data line pair IOP is provided for four sense amplifier circuits in one sense amplifier band. Column decoders CD01–CD0q are provided corresponding to sense amplifier bands SA#01–SA#0q. Row decoders RD01–RD0m are provided corresponding to memory blocks MB01–MB0m. Row decoders RD11–RD1m are provided corresponding to memory blocks MB11–MB1m, respectively. Column decoders CD11–CD1q are provided corresponding to sense amplifier bands SA#11–SA#1q, respectively. AND circuits YG1–YGq are provided corresponding to column decoders CD01–CD0q. AND circuits GY1–GYq are provided corresponding to column decoders CD11–CD1q. AND circuits XG1–XGm are provided corresponding to column decoders RD01–RD0m, respectively. AND circuits GX1–GXm are provided corresponding to row decoders RD11–RD1m, respectively.

AND circuit XGi receives a block specify signal BXi generated from block address (block address signal Bx), a bank specify signal RBA0 generated from bank address (row bank address signal RBA), and row address signal X. When bank specify signal RBA0 and block specify signal BXi are both at a selected state, AND circuit XGi transmits row address signal X to a corresponding row decoder RD0i. Similarly, AND circuit GXi receives bank specify signal RBA0, block specify signal BXi, and row address signal X and applies row address signal X to a corresponding row decoder RD1i when bank specify signal RBA0 and block specify signal BXi are both at a selected state, whereby row decoder RD1i executes a decode operation.

AND circuit YGj receives a sub array specify signal AY0 generated from a block address, a sense amplifier band specify signal BYj, and a column bank signal CBA0 generated from a bank address. AND circuit YGj applies column address signal Y to a corresponding column decoder CD0J when column bank signal CBA0, sense amplifier band specify signal BYj and sub array specify signal AY0 are all at a selected state, whereby column decoder CD0j executes a decode operation. A column select operation is carried out in two sense amplifier bands by virtue of the shared sense amplifier structure.

Similarly, for AND circuits GY1–GYq, sub array specify signal AY1, sense amplifier band specify signals BY1–BYq, column bank signal CBA0 and column address signal Y are applied.

In one bank, one memory block is driven to a selected state in each of two memory sub arrays. In column access, the sense amplifier block is specified, and column selection is executed in the sense amplifier band of one of memory sub arrays MAB0 and MAB1. In column access, a plurality of word lines can be accessed selectively in the page mode in one bank by using the column bank signal and sub array specify signal.

Figure 15:
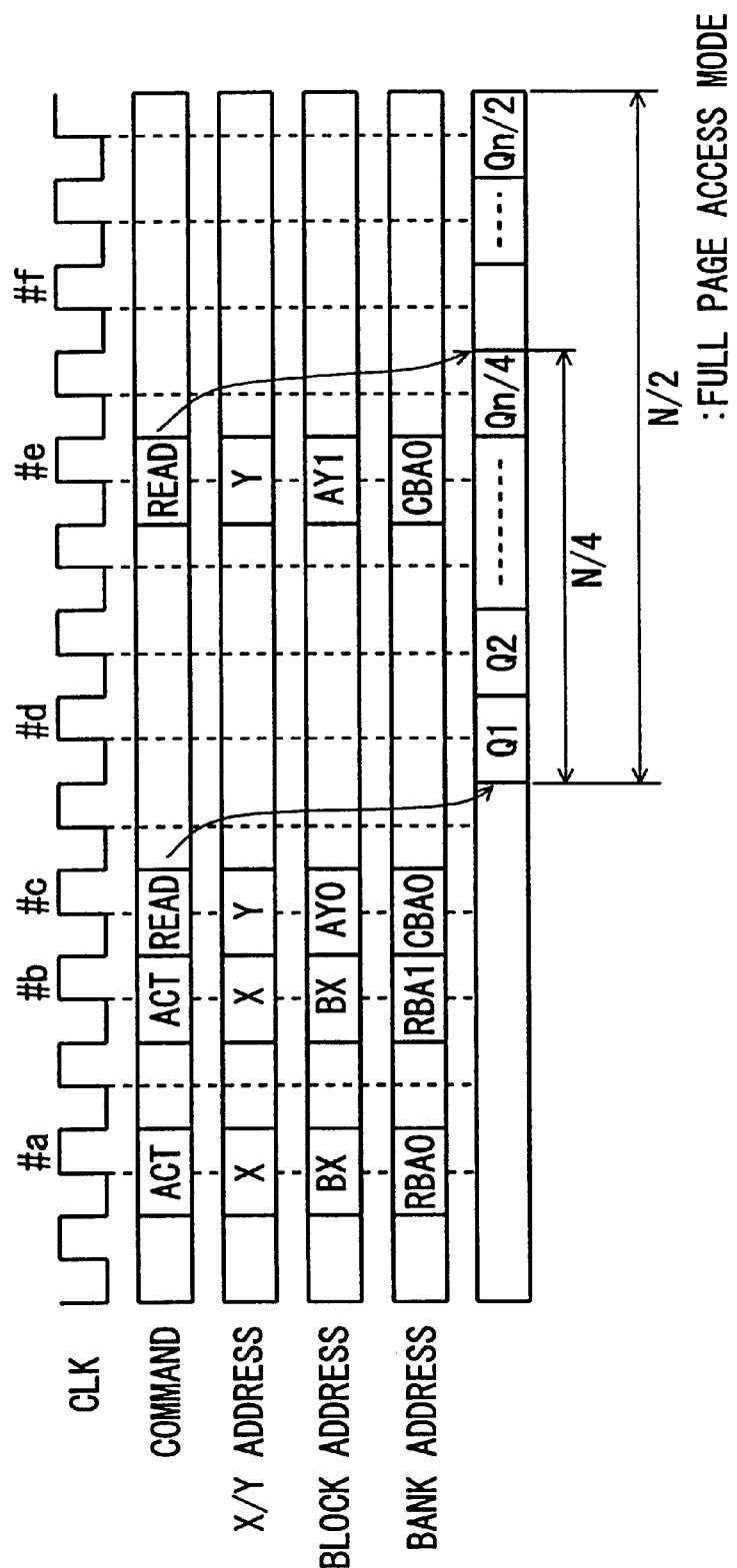
FIG. 15 is a timing chart representing a data readout operation of the semiconductor memory device of FIGS. 13 and 14.

FIG. 15 is a timing chart representing a page mode operation of the semiconductor memory device of the fourth embodiment. Referring to the timing chart of FIG. 15, the page mode operation of the semiconductor memory device of the fourth embodiment will be described.

At cycle #a of clock signal CLK, a row access command (array activation command) ACT is applied. At the same time, row address signal X and a bank address for activating bank specify signal RBA0 are applied. Accordingly, bank #0 is specified. In bank #0, the word line in the specified memory block is driven to a selected state according to block address signal BX. Since a memory sub array is not specified, two memory blocks are selected at the same time in the specified bank.

At clock cycle #b, row access command ACT is applied again. At this stage, a bank address for activating bank specify signal RBA1 is applied to specify the bank #1. In bank #1, two memory blocks are selected according to block address signal BX and row address signal X, and corresponding word lines are driven to a selected state.

At clock cycle #c, read command READ is applied. At the same time, a bank address for activating column bank signal CBA0, a block address for activating sub array specify signal AY0 and column address signal Y are applied. In bank #0, a column select operation is carried out in the memory sub array specified by sub array specify signal AY0. The sense amplifier circuits provided for one memory block are selected according to column address signal Y.

From clock cycle #d, data Q1, Q2 are sequentially read out according to this read command.

At clock cycle #e, read command READ is applied again, and a bank address for activating column bank signal CBA0, block address for activating sub array specify signal AY1, and column address signal Y are applied. Bank #0 is specified again, and memory sub array MAB1 is specified. Therefore, column access is executed with respect to the remaining one of the two word lines that are driven to a selected state at the same time. Following the readout of N/4 data by the read command at clock #c, data are read out from different sense amplifier bands. By the page mode, the total of N/2 data can be readout sequentially.

In the data readout operation of the FIG. 15, data Q1 . . . Qn/2 are sequentially read out in synchronization with clock signal CLK. However, data on internal data line pair IOP can be read out simultaneously in parallel. Alternatively, data on internal data line pair IOP can be read out in parallel for every predetermined number of bits. Also, data can be read out in synchronization with both rising edge and falling edge of clock signal CLK.

Although the operation sequence for data readout is shown in FIG. 15, data can be written similarly according to the page mode.

In data readout, data access can be executed continuously for a bank (#1) specified by bank specify signal RBA1 after the access of data of bank specify signal RBA0.

Also, a page mode operation can be executed in which column address signal Y is sequentially modified and column select lines CSL0–CSL3 are sequentially driven to a selected state.

According to the fourth embodiment of the present invention, a plurality of word lines are driven to a selected state simultaneously in a bank including a plurality of memory sub arrays, and a column is accessed according to a memory sub array specify signal. Therefore, the page size can be increased without increasing the width of the internal data bus.

Fifth Embodiment

Figure 16:
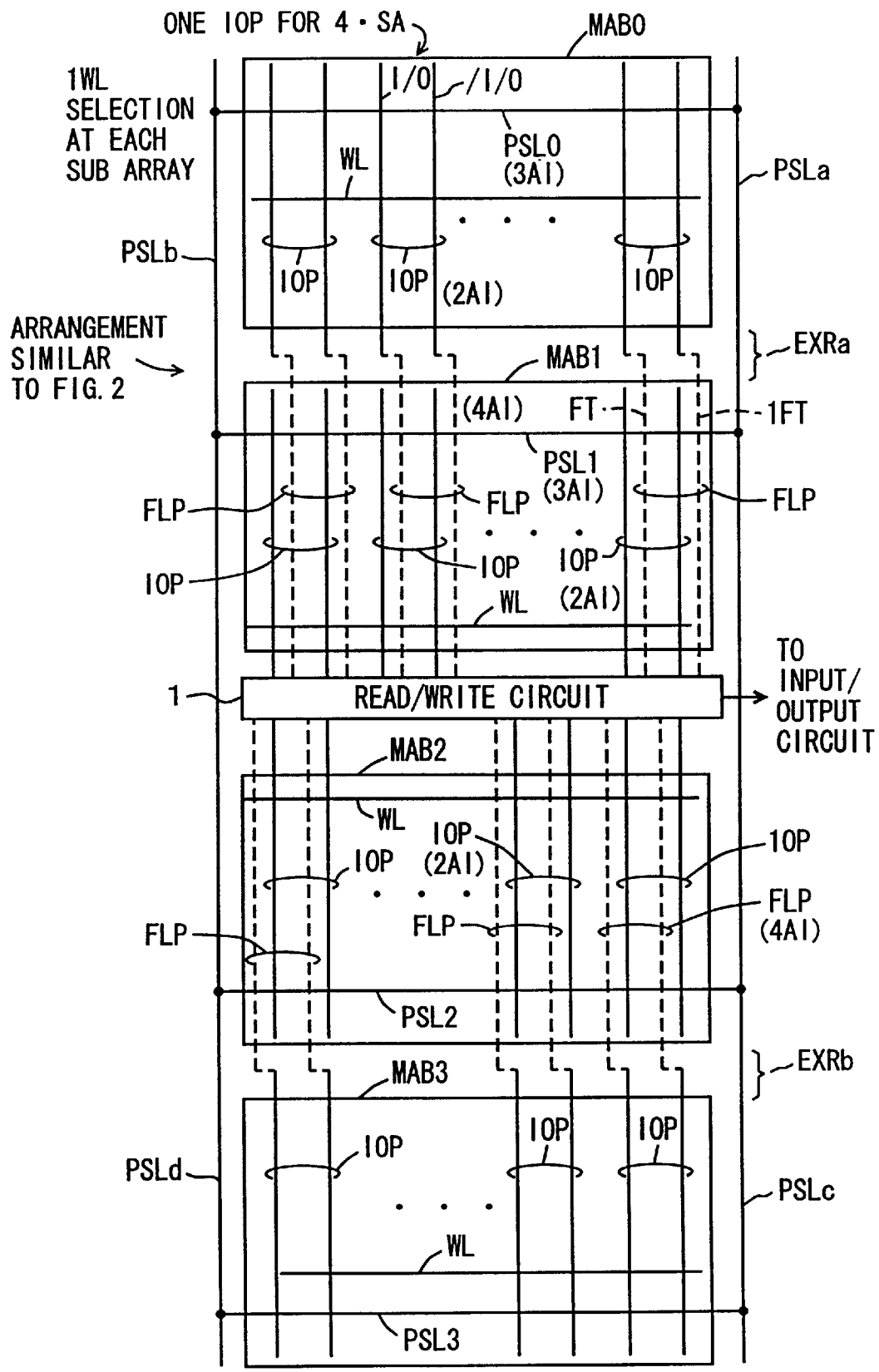
FIG. 16 schematically shows a structure of a main part of a semiconductor memory device according to a fifth embodiment of the present invention.

FIG. 16 schematically shows the structure of an array portion of a semiconductor memory device according to a fifth embodiment of the present invention. In FIG. 16, memory sub arrays MAB0 and MAB1 are arranged at one side of read/write circuit 1, and memory sub arrays MAB2 and MAB3 are arranged at the other side of read/write circuit 1. Memory transferred at the same time. More specifically, the number of data bits that can be transferred at one time can be made equal to the number of memory cells connected to one word line WL. Therefore, the data transfer rate can be improved significantly.

In the structure shown in FIG. 16, internal data line pair IOP can be formed of a single end internal data line IOL as described later. Each of memory sub arrays MAB0–MAB3 has the same structure. Feed-through line pair FLP is arranged extending over the memory sub array in the proximity of read/write circuit 1. By providing an optimum design of one memory sub array, the number of memory sub arrays can be increased to easily increase the memory capacity.

In the structure of FIG. 16, a plurality of memory blocks can be provided in each of memory sub arrays MAB0–MAB3. A structure in which one memory block is selected in each memory sub array can be employed.

The specific structure of memory sub arrays MAB0–MAB3 of FIG. 16 is similar to that shown in FIG. 2.

[Modification]

Figure 17:
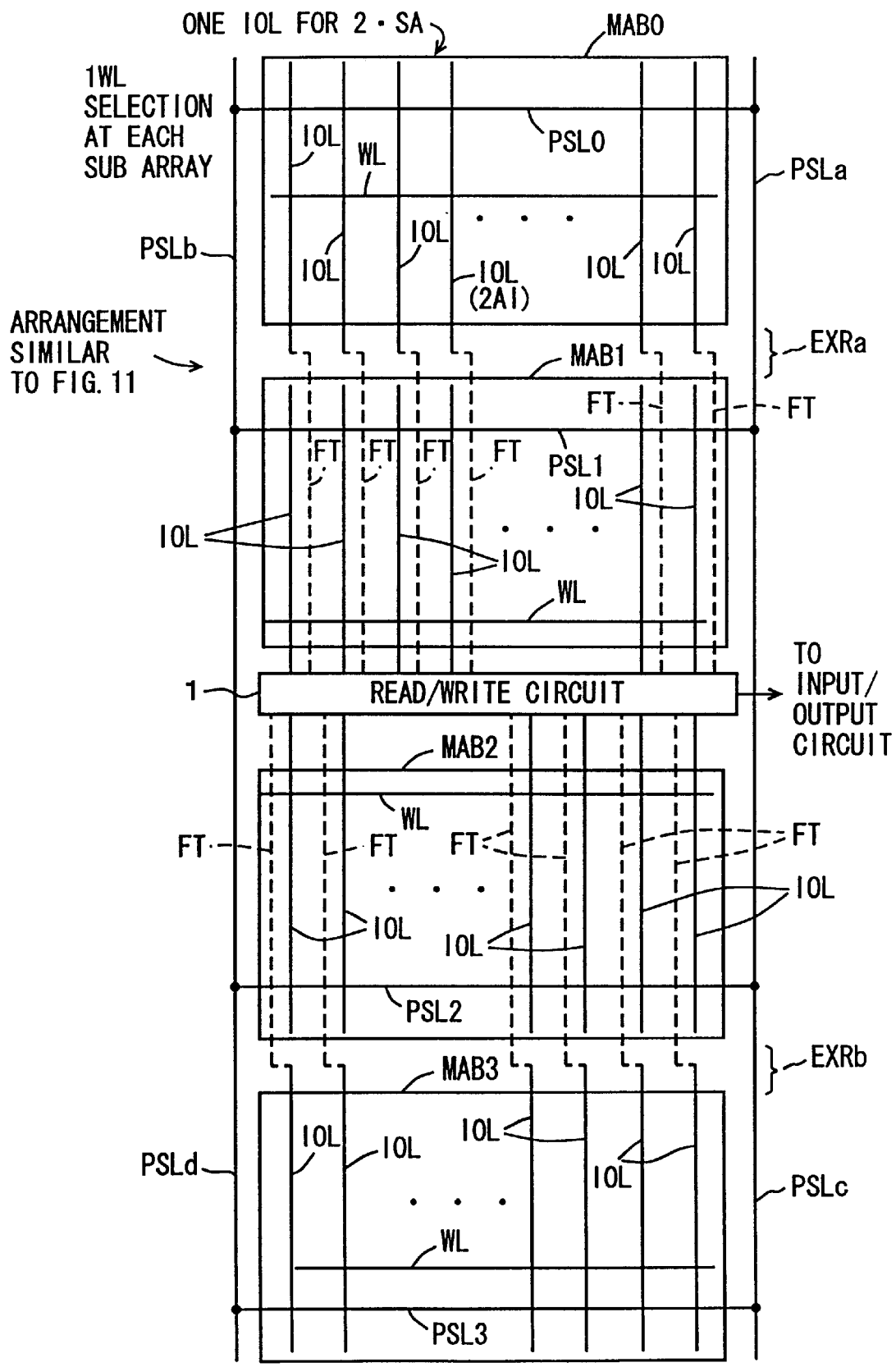
FIG. 17 schematically shows a structure of a modification of the fifth embodiment of the present invention.

FIG. 17 shows a modification of the fifth embodiment. Referring to FIG. 17, an internal data line IOL of a single end structure is used instead of internal data line pair IOP. Also, a feed-through line FT is used instead of feed-through line pair FLP. The remaining structure is similar to that shown in FIG. 16, and corresponding components have the same reference characters allotted.

In the arrangement shown in FIG. 17, one word line WL is selected in each of memory sub arrays MAB0–MAB3 at the same time. One internal data line IOL is arranged per two sense amplifier circuits with respect to one sense amplifier band. When the number of memory cells connected to one word line WL, i.e., the number of sense amplifier circuits provided corresponding to one word line WL, is N, data of 2·N bits can be transferred by executing the column select operation simultaneously in memory sub arrays MAB0–MAB3. Thus, the internal data transfer rate can be further improved. sub arrays MAB0, MAB1, MAB2 and MAB3 have an internal data line structure identical to that shown in FIG. 1. In each of memory sub arrays MAB0–MAB3, one internal data line pair IOP is arranged per four sense amplifier circuits with respect to one sense amplifier band. Internal data line pair IOP provided for memory sub array MAB0 is connected to feed-through line pair FLP located at an upper layer in line exchange region EXRa. Feed-through line pair FLP is arranged extending in the column direction over memory sub array MAB1. Read/write circuit 1 includes a preamplifier and a write driver. Internal data line pairs IOP provided corresponding to feed-through line pairs FLP and memory sub array MAB1 are coupled in parallel to preamplifiers and write drivers in read/write circuit 1.

Internal data line pair IOP of memory sub array MAB3 is connected to feed-through line pair FLP arranged extending in the column direction over memory sub array MAB2 at line exchange region EXRb. Internal data line pair IOP provided corresponding to memory sub array MAB and feed-through line pair FLP are formed at different interconnection layers. Internal data line pair IOP provided for memory sub array MAB2 and feed-through line pair FLP provided for memory sub array MAB3 are coupled to preamplifiers and write drivers in read/write circuit 1. Sense amplifier power supply lines PSL0–PSL3 are arranged for memory sub arrays MBA0–MAB3, respectively and are connected to power supply lines PSLa–PSLd extending in the column direction to enhance the sense power supply.

The structure of FIG. 16 provides the following advantages in addition to the advantages provided by the semiconductor memory device of the first embodiment. In each of memory sub arrays MAB0–MAB3, a word line WL is driven to a selected state at the same time. More specifically, four word lines WL are selected at the same time. One internal data line pair IOP is arranged for four sense amplifier circuits SA with respect to one sense amplifier band. By using feed-through line pair FLP, the internal data line pairs in memory sub arrays MAB0–MAB3 are coupled to read/write circuit 1 in parallel. Therefore, data of a number identical to the number of sense amplifier circuits in one sense amplifier band can be According to the fifth embodiment of the present invention, two memory sub arrays are provided at both sides of a read/write circuit, and the internal data line in the memory sub array located farther from the read/write circuit is extended by the feed-through line. Therefore, data can be transferred in parallel from a plurality of memory sub arrays to allow the internal data transfer rate to be increased.

Sixth Embodiment

Figure 18:
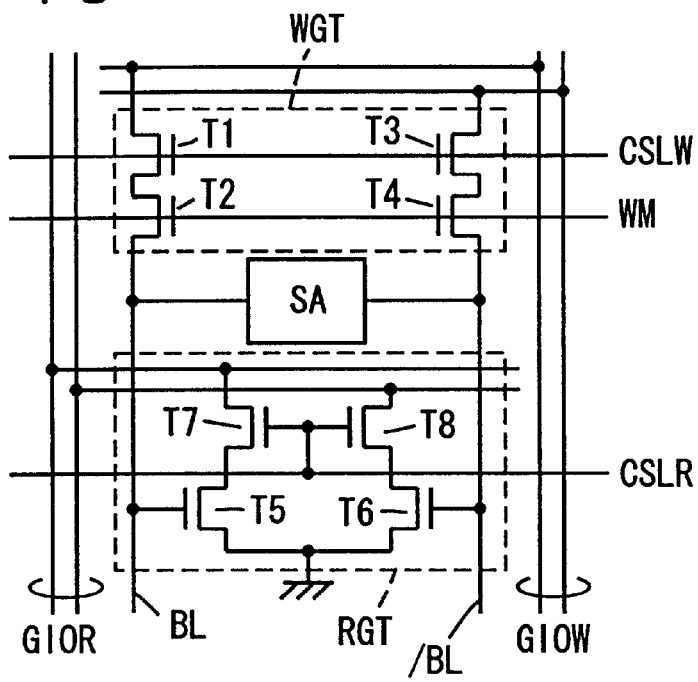
FIG. 18 schematically shows a structure of a main part of a semiconductor memory device according to a sixth embodiment of the present invention.

FIG. 18 shows a structure of a main part of a semiconductor memory device according to a sixth embodiment of the present invention. FIG. 18 shows the structure related to one sense amplifier circuit SA. Referring to FIG. 18, a read data line pair GIOR transmitting readout data and a write data line pair GIOW transmitting write data are provided individually. These read data line pair GIOR and write data line pair GIOW are arranged corresponding to a predetermined number (for example 4) of sense amplifier circuits SA with respect to one sense amplifier band.

A read gate RGT transmitting the data on bit lines BL and /BL onto read data line pair GIOR according to read column select signal CSLR, and a write gate WGT coupling write data line pair GIOW to sense amplifier circuit SA according to a write column select signal SCLW and a write data mask designation signal WM for sense amplifier circuit SA.

Write gate WGT includes transfer gates (n channel MOS transistor) T1 and T3 receiving write column select signal CSLW at their gates, and transfer gates T2 and T4 connected in series with transfer gates T1 and T3, and receiving the write data mask designation signal WM at their gates. A series body of transfer gates T1 and T2 is coupled to bit line BL. A series body of transfer gates T3 and T4 is coupled to complementary bit line /BL.

Read gate RGT includes n channel MOS transistors T5 and T6 for amplifying the difference of the potentials on bit lines BL and /BL, and transfer gates T7 and T8 coupling MOS transistors T5 and T6 to the read data line of the read data pair according to read column select signal CSLR.

Write data mask designation signal WM functions to apply a mask on data writing in the unit of a predetermined number of bits. When write data mask designation signal WM attains an active state (L level) and a state inhibiting data writing is specified, sense amplifier circuit SA is disconnected from global write data line pair GIOW even when write column select signal CSLW is at a selected state. Therefore, data is not written. When write data mask designation signal WM is in an inactive state of an H level to allow data writing, sense amplifier circuit SA is coupled with global write data line pair GIOW according to write column select signal CSLW, whereby the write data from a write driver not shown is transmitted and latched in sense amplifier circuit SA via write gate WGT.

In a readout mode, read column select signal CSLR is driven to a selected state, and MOS transistors T5 and T6 are coupled to read data line pair GIOR. MOS transistors T5 and T6 have their gates connected to bit lines BL and /BL. A signal corresponding to the potential difference between bit lines BL and /BL is transmitted to read data line pair GIOR. Read gate RGT is substantially a differential amplifier. Global read data line pair GIOR is disconnected from bit lines BL and /BL. Therefore, the data readout operation of read gate RGT does not affect the potentials of bit lines BL and /BL. When this read gate RGT is used, data can be read out prior to completion of the sense operation of sense amplifier circuit SA. Thus, high speed readout is allowed.

In write gate WGT, the position of transfer gates T1 and T3 receiving write column select signal CSLW at their gates can be exchanged with the position of transfer gates T2 and T4 receiving write data mask designation signal WM at their gates. When write gate WGT of a plurality of memory blocks is coupled to write data line pair GIOW, transfer gates T1 and T3 receiving write column select signal CSLW at their gates are disconnected from write data line pair GIOW by write data mask designation signal WM for the sense amplifier circuit that is inhibited of data writing. Even if write column select signal CSLW is driven to a selected state, the output load of the write driver can be alleviated since the capacitive coupling of transfer gates T1 and T3 does not affect write data line pair GIOW when writing is inhibited.

Figure 19:
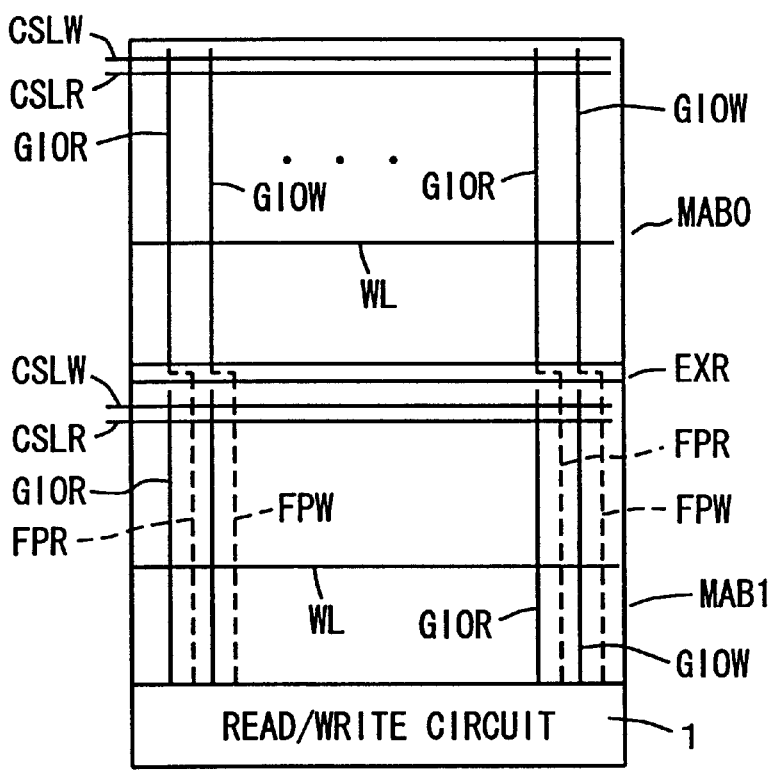
FIG. 19 schematically shows a structure of an array portion according to a sixth embodiment of the present invention.

FIG. 19 schematically shows a structure of the array portion of the semiconductor memory device of the sixth embodiment. In FIG. 19, memory sub arrays MAB0 and MAB1 are arranged along the column direction. In memory sub array MAB1, a global read data line pair GIOR transmitting readout data and a global write data line pair GIOW transmitting write data are arranged for every predetermined number of sense amplifier circuits (in one sense amplifier band). On memory sub array MAB1, read feed-through line pair FPR and write feed-through line pair FPW are arranged at an upper layer above global read data line pair GIOR and global write data line pair GIOW.

Similarly, in memory sub array MAB0, global read data line pair GIOR extending in the column direction and transmitting read out data and global write data line pair GIOW transmitting write data are arranged for every predetermined number of sense amplifier circuits. Global read data line pair GIOR and global write data line pair GIOW provided corresponding to memory sub array MAB0 are connected to read feed-through line pair FPR and write feed-through line pair FPW in line exchange region EXR. Therefore, by providing the write data line and the read data line individually in the structure of FIG. 19, the number of data bits that can be transferred at one time can be increased even when the pitch condition becomes more critical. A word line WL is selected in memory sub array MAB0 and MAB1 at the same time, and write column select signal CSLW or read column select signal CSLR is driven to a selected state in parallel in memory sub arrays MAB0 and MAB1.

[Modification]

Figure 20:
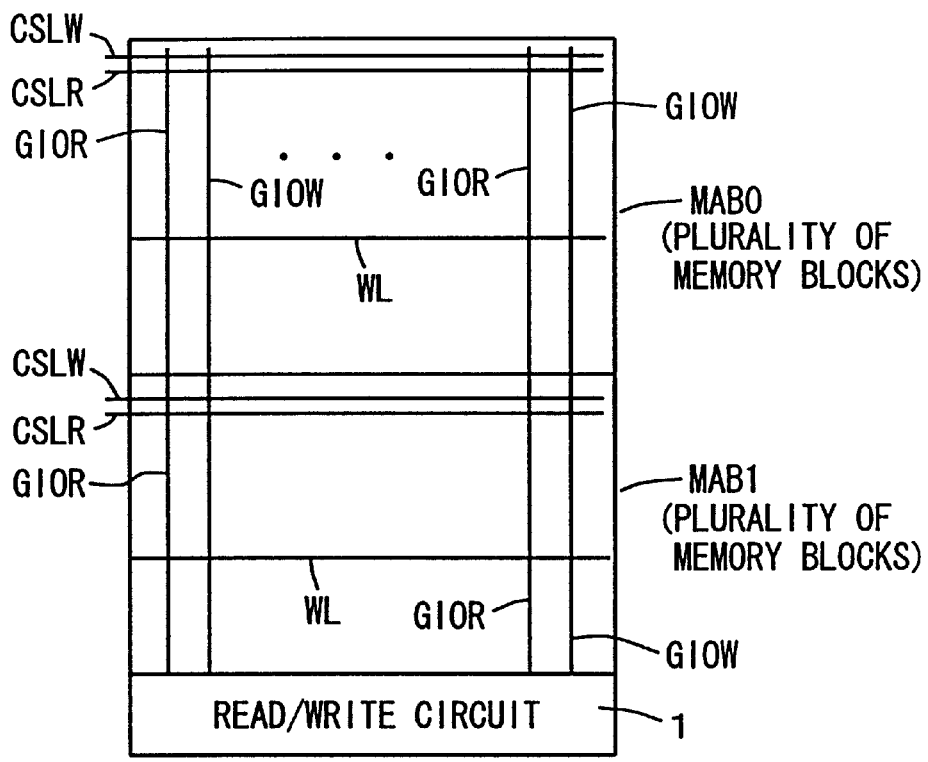
FIG. 20 schematically shows a modification of the sixth embodiment of the present invention.

FIG. 20 shows a modification of the array portion of the semiconductor memory device of the sixth embodiment. Referring to FIG. 20, each of memory sub arrays MAB0 and MAB1 includes a plurality of memory blocks. Global write data line pair GIOW transmitting write data and global read data line pair GIOR transmitting read data are arranged extending in the column direction, common to memory sub arrays MAB0 and MAB1.

In each of memory sub arrays MAB0 and MAB1, a word line select operation and a column select operation are executed in memory block unit. More specifically, a block address and a column access command are applied at the same time in specifying a sense amplifier band in a column access operation (column select operation). Accordingly, word lines WL driven to a selected state at the same time in memory sub arrays MAB0 and MAB1 can be sequentially accessed by a column access command. The page size in data writing and reading can be increased.

Figure 21:
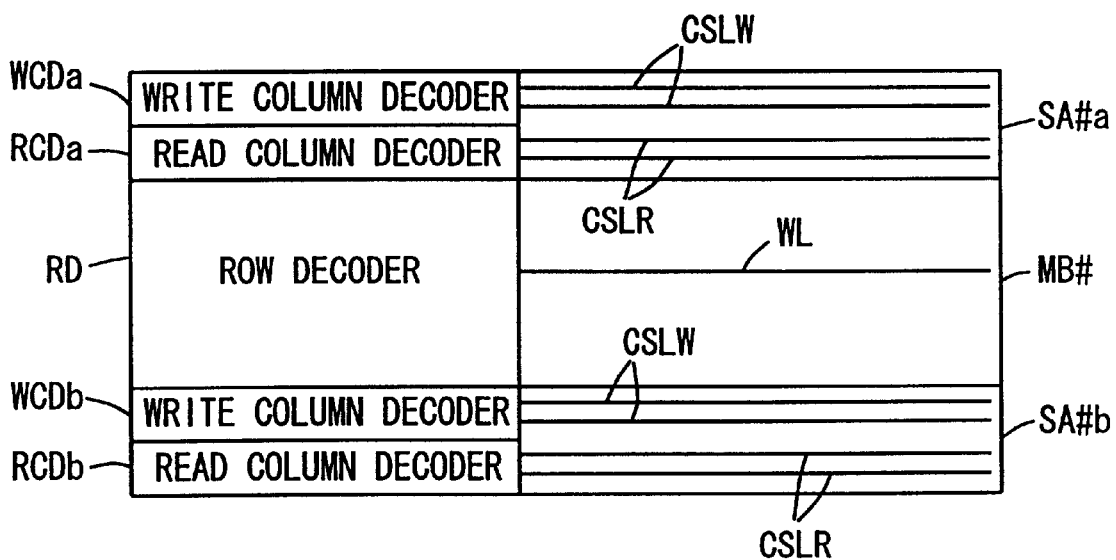
FIG. 21 schematically shows a structure of row and column select circuits of the sixth embodiment.

FIG. 21 schematically shows arrangement of the decoder in the sixth embodiment. Referring to FIG. 21, sense amplifier bands SA#a and SA#b are arranged with respect to memory block MB#. A write column decoder WCDa driving write column select line CSLW to a selected state and a read column decoder RCDa driving read column select signal CSLR to a selected state are arranged with respect to sense amplifier band SA#a. Write column decoder WCDb and read column decoder RCDb are arranged with respect to sense amplifier band SA#b. The numbers of write column select lines CSLW and of read column select lines CSLR arranged in one sense amplifier band are determined appropriately according to the number of internal data line pairs and the number of sense amplifier circuits. Row decoder RD is arranged for memory block MB#.

Memory block MB# is arranged in memory sub arrays MAB0 and MAB1 as shown in FIG. 19 or 20. Word line WL is selected in selected memory block MB#. According to a data write mode or a data read mode, write column decoders WCDa and WCDb or read column decoders RCDa and RCDb are rendered active. In this column access, a block address signal that specifies a sense amplifier band is used (in the case according to the operation mode of the second or fourth embodiment).

In the arrangement of FIG. 19, the column decoder and read column decoder of memory block MB#, when in a selected state, can be set to an enable state. However, it is to be noted that write column decoder WCDa and read column decoder RCDa are rendered enable when either of memory block MB# and the memory block that shares sense amplifier band SA#a is driven to a selected state due to the shared sense amplifier structure. Similarly, write column decoder WCDb and read column decoder RCDb are set to an enable state when either of memory block MB# and the memory block that shares sense amplifier band SA#b is driven to a selected state.

The I/O isolation structure in which the internal write data line and internal read data line are provided individually can be applied to any of the first to fourth embodiments. Even if the number of internal data lines is increased, the internal data transfer rate can be improved without modifying the pitch condition of the internal data lines according to the structure of the first to fourth embodiments.

When the internal data transfer rate is set similar to that of a conventional case in the I/O isolation structure, the pitch condition of the read data line and write data line can be alleviated and the line capacitance between internal data lines can be reduced to allow transfer of a signal of a small amplitude at high speed.

Seventh Embodiment

Figure 22:
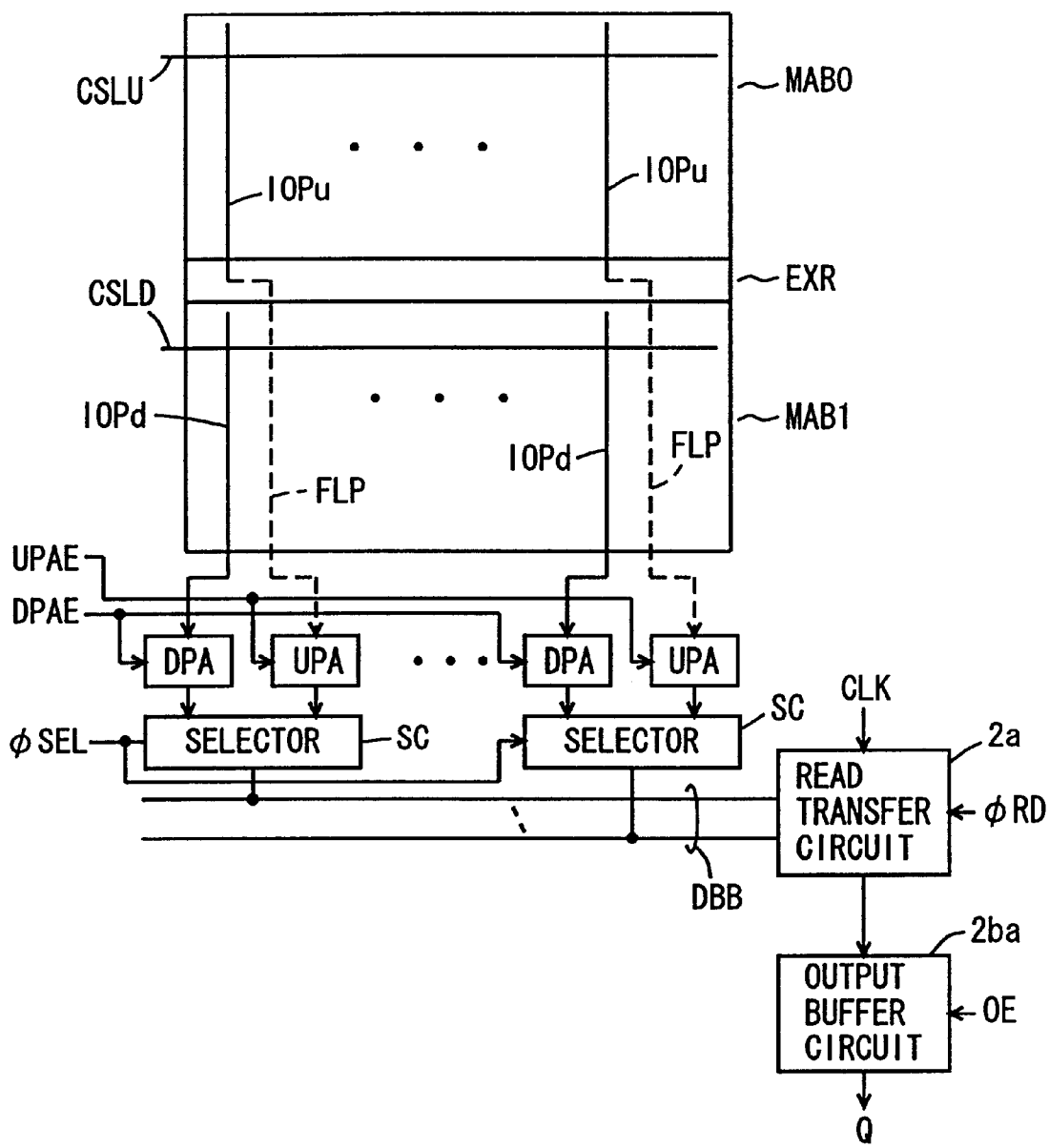
FIG. 22 schematically shows a structure of a main part of a semiconductor memory device according to a seventh embodiment of the present invention.

FIG. 22 schematically shows a structure of a main part of a semiconductor memory device according to a seventh embodiment of the present invention. In FIG. 22, the memory array is divided into two memory sub arrays MAB0 and MAB1. The structure of memory sub arrays MAB0 and MAB1 is similar to that of any of the previous first, third and fifth embodiments. In memory sub arrays MAB0 and MAB1, the word lines are driven to a selected state at the same time.

One internal data line pair IOPd is provided for every predetermined number of sense amplifier circuits for one sense amplifier band with respect to memory sub array MAB1. Similarly with respect to memory sub array MAB0, an internal data line pair IOPu is arranged for every predetermined number of sense amplifier circuits for one sense amplifier band. Internal data line pair IOPu for memory sub array MAB0 is connected to feed-through line pair FLP arranged extending in the column direction at a layer upper than internal data line pair IOPd on memory sub array MAB1 in line exchange region EXR.

Column selection of memory sub array MAB0 is carried out according to a column select signal CSLU from a column decoder not shown. The column selection in memory sub array MAB1 is carried out according to a column select signal CSLD from a column decoder not shown.

Corresponding to internal data line pair IOPd, a preamplifier DPA rendered active in response to a preamplifier activation signal DPAE is provided. With respect to each feed-through line pair FLP, a preamplifier UPA rendered active in response to activation of a preamplifier activation signal UPAE is provided.

Corresponding to each set of preamplifiers DPA and UPA, a selector SC selecting the output of one preamplifier out of the corresponding set of preamplifiers in response to a select signal φSEL is provided. Selector SC is coupled to internal data transmission line DBB.

Figure 23:
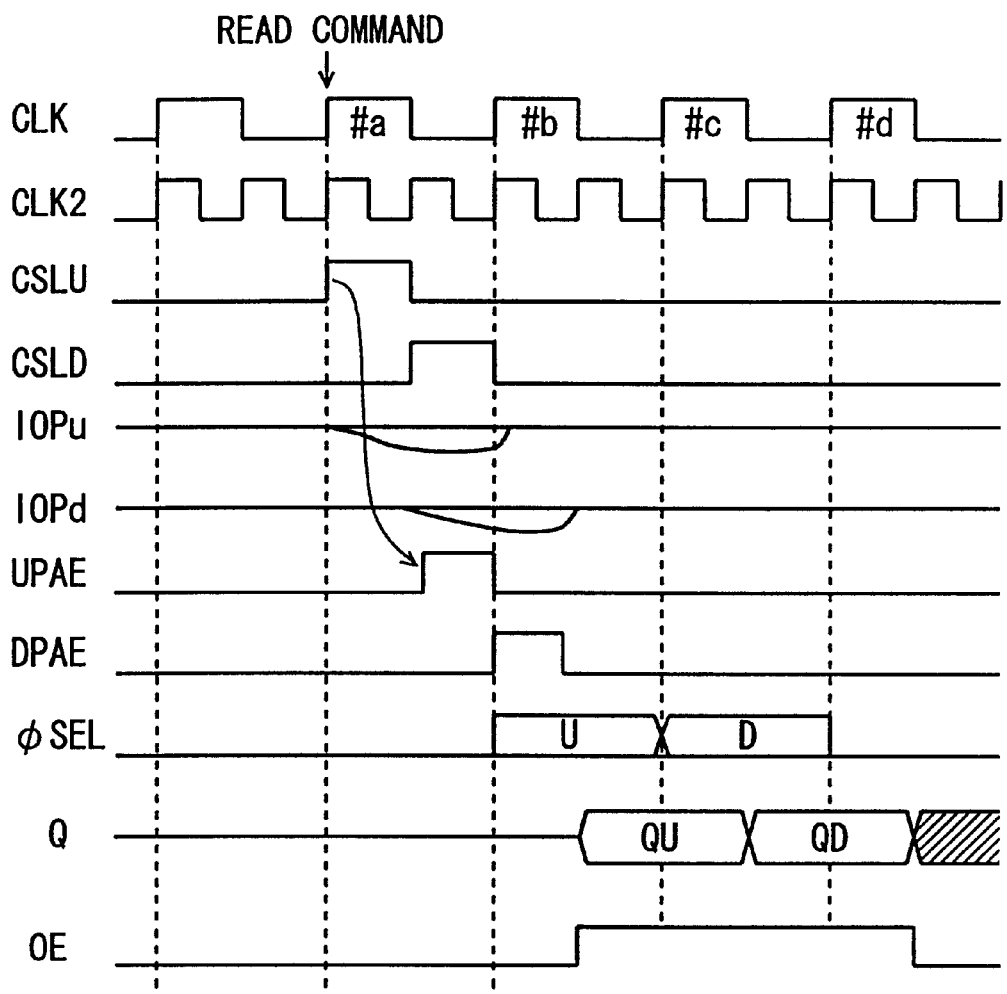
FIG. 23 is a timing chart representing an operation of the semiconductor memory device of FIG. 22.

Internal data transmission line DBB is coupled to a read transfer circuit 2a transferring data in synchronization with clock signal CLK in response to a read operation activation signal φRD. The data output from read transfer circuit 2a is applied to output buffer circuit 2ba. Output buffer circuit 2ba is rendered active when output enable signal OE is activated to receive and output the data transferred in synchronization with clock signal CLK from read transfer circuit 2a. The operation of the semiconductor memory device of FIG. 22 will now be described with reference to the timing chart of FIG. 23.

Clock signal CLK is frequency-multiplied to generate an internal clock signal CLK2 that has a doubled frequency of clock signal CLK. Column select signals CSLU and CSLD are activated according to frequency-multiplied clock signal CLK2. Preamplifier activation signals UPAE and DPAE are also rendered active according to clock signal CLK2.

At cycle #a, a read command is applied. Simultaneously, memory sub array MAB0 is specified. First, column select signal CSLU is driven to a selected state. The data held in the sense amplifier circuits of memory sub array MAB0 are read out via internal data line pairs IOPu and feed-through line pairs FLP. Upon activation of column select signal CSLU, column select signal CSLD is driven to a selected state at clock cycle #a according to frequency-multiplied clock signal CLK2. The data held in a selected sense amplifier circuit of memory sub array MAB1 is transmitted on internal data line pair IOPd.

When the data is transmitted to preamplifier UPA via internal data line IOPu and feed-through line pair FLP, preamplifier activation signal UPAE is rendered active. Preamplifier UPA amplifies and latches the data applied via feed-through line pair FLP.

At cycle #b, preamplifier activation signal DPAE is rendered active when the data on internal data line pair IOPd is increased in amplitude enough. The data on internal data line pair IOPd is amplified and latched by preamplifier DPA.

Concurrently with the amplify operation of preamplifier DPA, select signal φSEL is set to a state (U) for selecting preamplifier UPA. The data amplified and latched by preamplifier UPA is transmitted on internal data transmission line DBB. Then, read transfer circuit 2a transfers the data applied in synchronization with clock signal CLK to output the data via output buffer circuit 2ba. Here, the operation when data transmitted on the internal data line pair are all read out in parallel will be described.

At clock cycle #c, select signal φSEL is set to a state to select preamplifier DPA. The data amplified and latched by preamplifier DPA is transferred to internal data transmission line DBB. The data is output in synchronization with clock signal CLK via read transfer circuit 2a and output buffer circuit 2ba.

According to the structure of FIG. 22, all the data read/output circuits from selector SC to output buffer circuit 2ba operate in synchronization with clock signal CLK, whereas the column select operation is executed in synchronization with frequency-multiplied clock signal CLK2. The operation cycle of preamplifiers UPA and DPA is identical to that of clock signal CLK. Therefore, when the data held in the sense amplifier circuit is transmitted to preamplifiers DPA and UPA, data bits of two times the number of sense amplifier circuits selected by one column select signal can be transferred in one cycle of clock signal CLK. Therefore, the data transfer rate can be improved.

Since the column select circuit and preamplifier operate in a time divisional manner according to the structure of FIG. 22, the number of circuit elements that operate at the same time can be reduced to allow reduction of the peak current.

Figure 24:
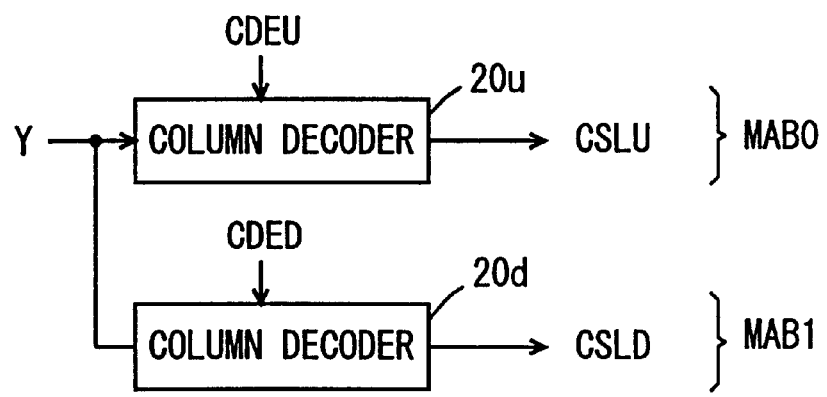
FIG. 24 schematically shows arrangement of a column decoder in the seventh embodiment of the present invention.

FIG. 24 schematically shows the structure of the column decoder that generates column select signals CSLU and CSLD of FIG. 22. In FIG. 24, column decoders 20u and 20d are provided corresponding to memory sub arrays MAB0 and MAB1, respectively. Each of column decoders 20u and 20d is provided corresponding to respective plurality of memory blocks in a corresponding memory sub array.

Column decoder 20u is rendered active in response to activation of column decoder enable signal CDEU, to decode column address signal Y and generate column select signal CSLU. Column decoder 20d is rendered active when column decoder enable signal CDED is activated, to decode column address signal Y and generate column select signal CSLD. Column decoder enable signals CDEU and CDED are rendered active in response to frequency-multiplied clock signal CLK2.

Figure 25:
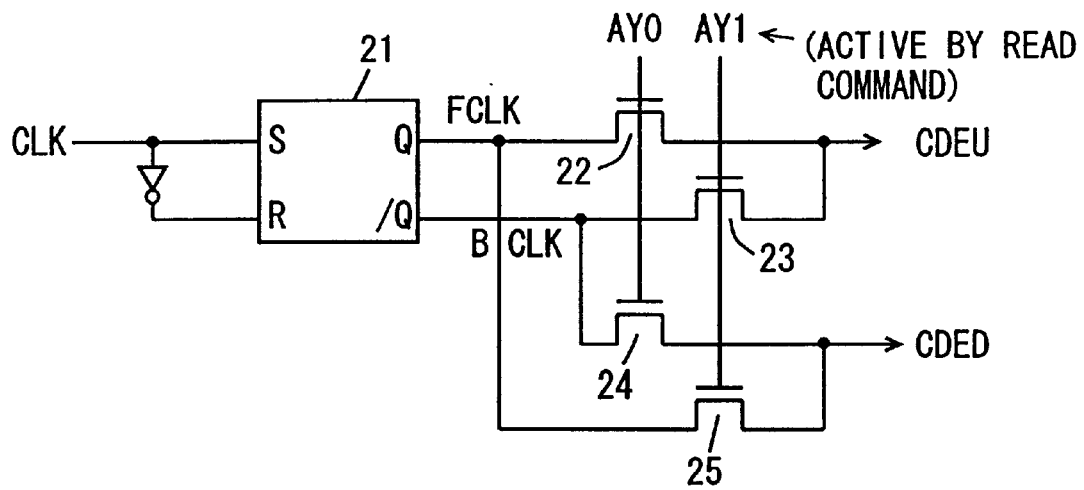
FIG. 25 schematically shows a structure of a column decoder enable signal generation unit of FIG. 24.

FIG. 25 schematically shows a structure of the column decoder enable signal generation unit for generating column decoder enable signals of FIG. 24. Referring to FIG. 25, the column decoder enable signal generation unit includes a flip flop 21 set in response to a rise of clock signal CLK and reset in response to a rise of an inverted signal of clock signal CLK, a transfer gate 22 selecting clock signal FCLK from output Q of flip flop 21 to generate column decoder enable signal CDEU when sub array specify signal AY0 is active, a transfer gate 24 rendered conductive, when sub array specify signal AY0 is active, to select clock signal BCLK from output /Q of flip flop 21 to generate column decode enable signal CDED, a transfer gate 23 rendered conductive, when sub array specify signal AY1 is active, to select clock signal BCLK from output /Q of flip flop 21 to generate column decoder enable signal CDEU, and a transfer gate 25 rendered conductive, when sub array specify signal AY1 is active, to select clock signal FCLK from output Q of flip flop 21 to generate column decoder enable signal CDED.

Sub array specify signals AY0 and AY1 specify memory sub arrays MAB0 and MAB1, respectively. Sub array specify signals AY0 and AY1 are each rendered active during a burst period (one cycle period of clock signal CLK in FIG. 23).

When a read command is applied and memory sub array MAB0 is specified, sub array specify signal AY0 is rendered active and transfer gates 22 and 24 conduct. Column decoder enable signals CDEU and CDED are rendered active in synchronization with clock signals FCLK and BCLK, respectively. Therefore, column decoder 20u shown in FIG. 24 is rendered active to carry out a decode operation, and then, column decoder 20d carries out a decode operation. When clock signal CLK is at an H level, clock signal FCLK attains an H level. When clock signal CLK attains an L level, clock signal BCLK is at an H level.

When a read command is applied and memory sub array MAB1 is specified, sub array specify signal AY1 is rendered active and transfer gates 23 and 25 conduct. Column decoder enable signals CDEU and CDED are rendered active in synchronization with clock signals BCLK and FCLK. Therefore, column decoder 20d of FIG. 24 is first rendered active and carries out a decode operation under this state. Then, column decoder 20u is rendered active to execute a decode operation.

Figure 26:
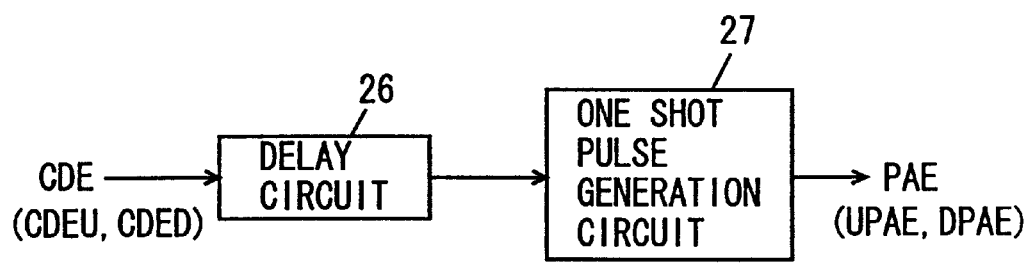
FIG. 26 schematically shows a structure of a preamplifier activation signal generation unit of FIG. 22.

FIG. 26 schematically shows a structure of the preamplifier activation signal generation unit of the seventh embodiment. Referring to FIG. 26, the preamplifier activation signal generation unit includes a delay circuit 26 delaying column decoder enable signal CDE (CDEU, CDED) by a predetermined time, and a one shot pulse generation circuit 27 responsive to activation of the output signal of delay circuit 26 to generate a one shot pulse signal. A preamplifier activation signal PAE (UPAE, DPAE) is generated from one shot pulse generation circuit 27.

By delaying column decoder enable signal CDE by a predetermined time, the preamplifier can be rendered active when a readout signal of sufficient amplitude is transmitted, taking into consideration the signal propagation delay in the internal data line pair and feed-through line pair.

Figure 27:
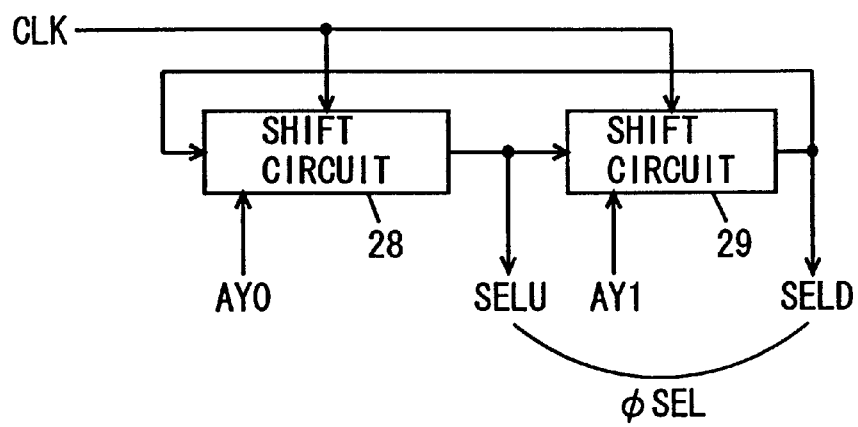
FIG. 27 schematically shows a structure of a select signal generation unit of FIG. 22.

FIG. 27 schematically shows a structure of the portion generating select signal φSEL of FIG. 22. Referring to FIG. 27, the select signal generation unit includes a shift circuit 28 having its input set in response to sub array specify signal AY0, and carrying out a shift operation to generate select signal SELU in synchronization with clock signal CLK, and a shift circuit 29 having its input set in response to sub array specify signal AY1, and carrying out a shift operation in synchronization with clock signal CLK. Shift circuits 28 and 29 are connected in a ring manner.

According to the structure of the select signal generation unit of FIG. 27, select signal SELU from shift circuit 28 is rendered active at an elapse of one clock cycle when sub array specify signal AY0 is active. Then, select signal SELD is rendered active at the next clock cycle. When sub array specify signal AY1 is at an active state, first select signal SELD is rendered active. Then, select signal SELU is rendered active at an elapse of one clock cycle.

The select signal generation unit of FIG. 27 has a structure in which a select operation is implemented with the column latency of 2 (at the elapse of one clock cycle from application of a read command, data is transferred of the internal data transmission line, and output at the next clock cycle). The select signal generation unit can have the time of generating select signals SELU and SELD adjusted taking into consideration the column latency (the activation timing of select signals SELU and SELD delayed by a predetermined cycle time of internal clock signal CLK according to the column latency).

As an alternative to the structure of the select signal generation unit of FIG. 27, preamplifier activation signals UPAE and DPAE can be used instead of sub array specify signals AY0 and AY1, respectively.

A similar operation is repeatedly executed in the case where the semiconductor memory device of the seventh embodiment operates in the burst mode and a column address signal Y is generated internally in synchronization with clock signal CLK. In this case, the data transfer operation from the sense amplifier circuit to the preamplifier is executed at a doubled frequency of clock signal CLK. However, column selection and preamplifier activation are effected in an interleaving manner of the memory sub array. The internal circuitry operates substantially at the cycle of clock signal CLK to allow data transfer correctly.

In data writing, the flow of signals is opposite to that in data readout, and a write driver is used instead of the preamplifier.

[Modification]

Figure 28:
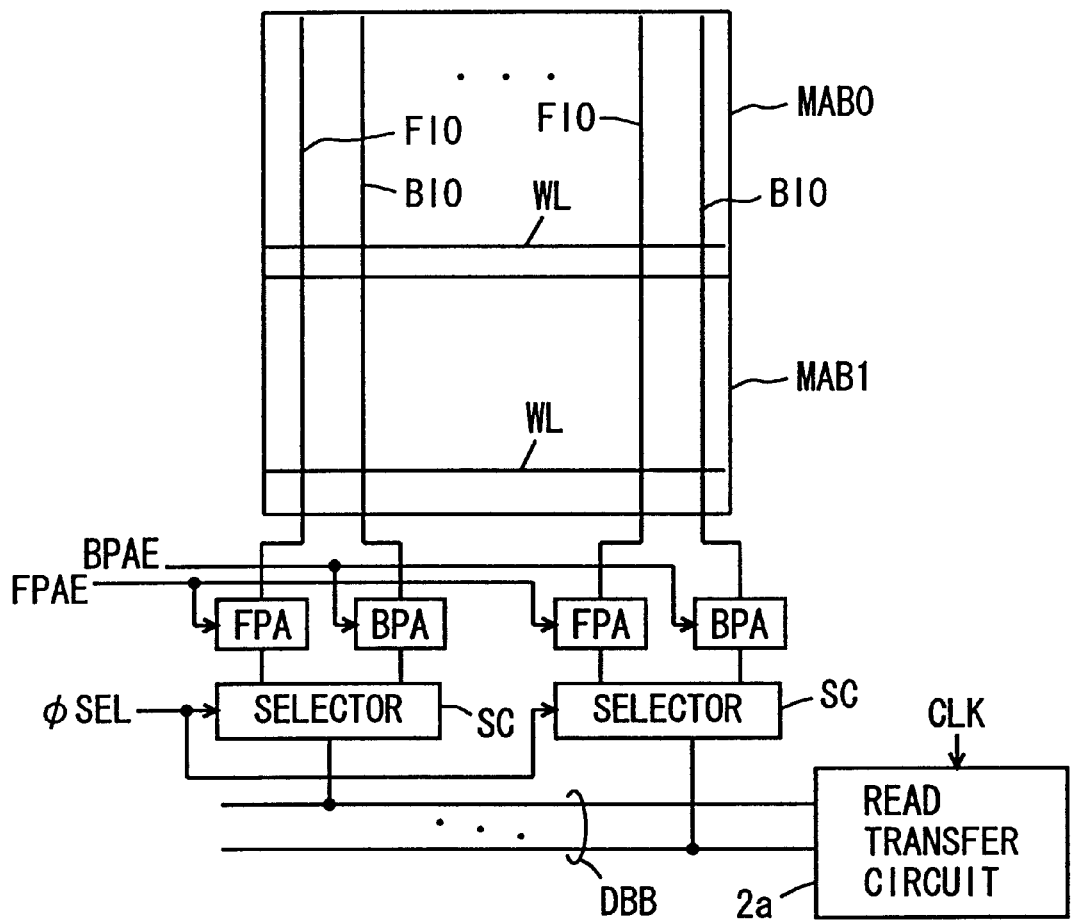
FIG. 28 schematically shows a structure of a modification of the semiconductor memory device of the seventh embodiment.

FIG. 28 schematically shows a structure of a modification of the seventh embodiment. In FIG. 28, the memory array is divided into two memory sub arrays MAB0 and MAB1. A first internal data line pair FIO and a second internal data line pair BIO are arranged in parallel along the column direction over memory sub arrays MAB0 and MAB1. Internal data line pairs FIO and BIO can be formed of the same or different interconnection layers.

A first preamplifier FPA is arranged corresponding to first internal data line pair FIO. A second preamplifier BPA is arranged corresponding to second internal data line pair BIO. First preamplifier FPA is rendered active in response to activation of preamplifier activation signal FPAE. Second preamplifier BPA is rendered active in response to activation of preamplifier activation signal BPAE. For each of the set of the first and second preamplifiers FPA and BPA, a selector SC is arranged selecting a preamplifier of the corresponding set in response to select signal φSEL. The signal output from selector SC is transmitted to read transfer circuit 2a via internal data transmission bus DBB. Read transfer circuit 2a transfers internal data in synchronization with clock signal CLK in the data readout mode. Memory sub arrays MAB0 and MAB1 include a plurality of memory cell blocks. Word lines in memory sub arrays MAB0 and MAB1 are driven to a selected state at a time. Memory sub arrays MAB0 and MAB1 may be banks.

Figure 29:
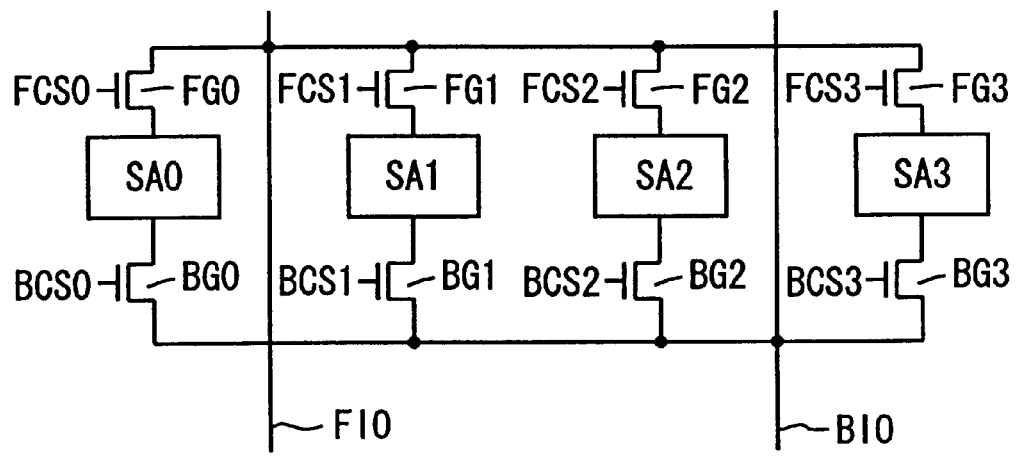
FIG. 29 schematically shows a structure of the portion of a sense amplifier band of the semiconductor memory device of FIG. 28.

FIG. 29 schematically shows a structure of the sense amplifier band of the memory sub array of FIG. 28. In FIG. 29, the sense amplifier band is arranged with four sense amplifier circuits SA0–SA3 being one unit. Column select gates FG0–FG3 rendered conductive when first column select signals FCS0–FCS3 from the column decoder are active are provided corresponding to sense amplifier circuits SA0–SA3, respectively. When column select gates FG0–FG3 conduct, each respective sense amplifier circuit is coupled to first internal data line pair FIO.

Corresponding to respective sense amplifier circuits SA0–SA3, second column select gates BG0–BG3 rendered conductive in response to activation of column select signals BCS0–BCS3 and coupling each respective sense amplifier circuit to second internal data line pair BIO are provided. One column select signal is driven to a selected state in one of the sets of first column select gates FG0–FG3 and second column select gates BG0–BG3. In the unit of sense amplifier circuits SA0–SA3, the sense amplifier circuit selected by the column select signal is connected to one of first and second internal data line pairs FIO and BIO.

According to the structure of FIGS. 28 and 29, a sense amplifier circuit of the sense amplifier bands provided corresponding to the memory block of one of memory sub arrays MAB0 and MAB1 is connected to one of first and second internal data line pairs FIO and BIO. A sense amplifier circuit of the sense amplifiers band provided corresponding to the memory block of the other memory sub array is connected to the other of the first and second internal data line pairs FIO and BIO. By executing the column select operation at a cycle two times that of clock signal CLK, the data transfer rate from the sense amplifier circuit to the preamplifier can be increased.

Figure 30:
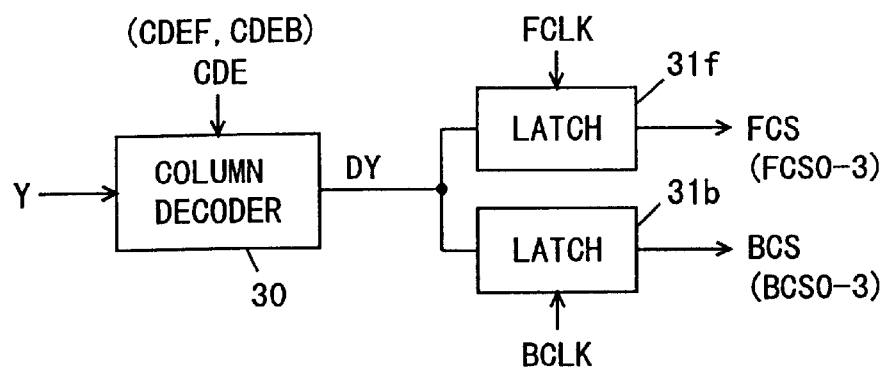
FIG. 30 schematically shows a structure of a column decoder of the semiconductor memory device of FIG. 28.
Figure 31:
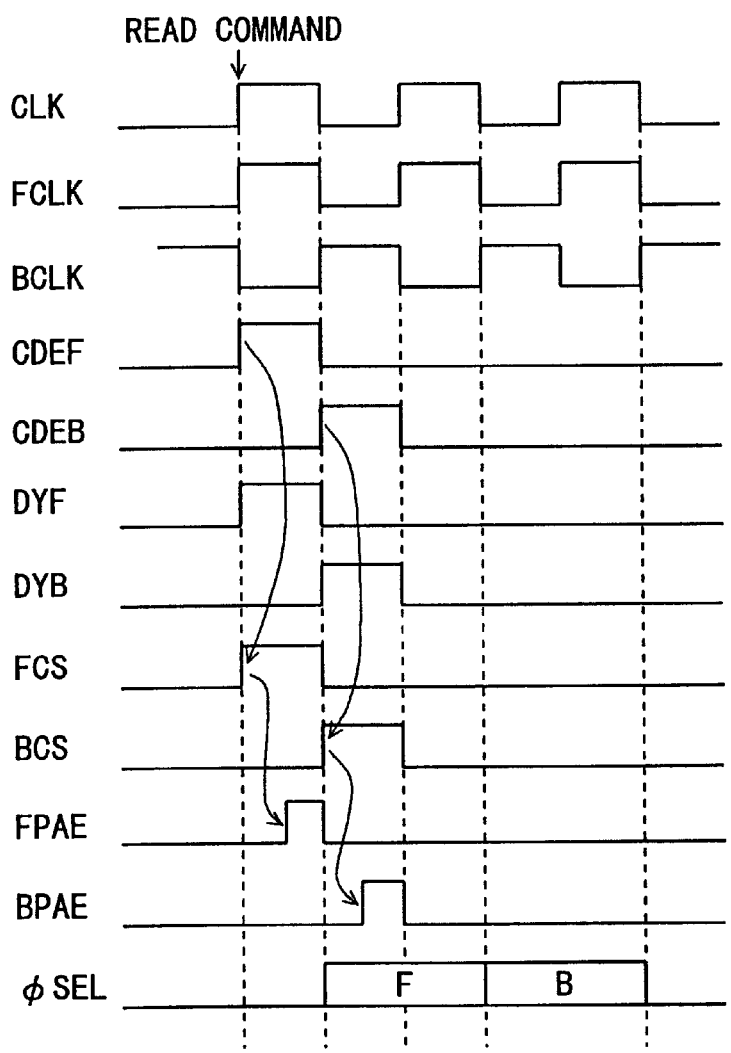
FIG. 31 is a timing chart representing an operation of the semiconductor memory device of FIGS. 28–30.

FIG. 30 schematically shows a structure of the column decode circuit provided corresponding to one sense amplifier band in the present modification. Referring to FIG. 30, the column decode circuit includes a column decoder 30 rendered active, in response to activation of column decoder enable signal CDE (CDEF or CDEB), to decode an applied column address signal Y, a latch circuit 31f latching decode signal DY output from column decoder 30 to generate a first column select signal FCS in response to clock signal FCLK, and a latch circuit 31b latching decode signal DY from column decoder 30 in response to clock signal BCLK, to generate a second column select signal BCS. The set of latch circuits 31f and 31b is provided corresponding to respective sets of column select signals FCS0–FCS3 and BCS0–BCS3 shown in FIG. 29. The operation of the structure shown in FIGS. 28–30 will now be described with reference to the timing chart of FIG. 31.

Clock signal FCLK is a clock signal in phase with clock signal CLK. Clock signal BCLK is an inverted clock signal of clock signal CLK. In memory sub arrays MAB0 and MAB1, word line WL is held at a selected state.

Upon application of a read command, column decoder enable signals CDEF and CDEB are rendered active according to clock signals FCLK and BCLK, respectively. According to a block address applied simultaneous to application of the read command, column decoder enable signal CDEF is applied to the column decoder provided corresponding to the memory sub array including the selected memory block, while column decoder enable signal CDEB is applied for the other memory sub array. Column decoder 30 shown in FIG. 30 carries out a decode operation according to column decoder enable signal CDEF or CDEB to generate decode signal DY. Therefore, decode signals DYF and DYB are generated according to column decoder enable signals CDEF and CDEB, respectively.

Latch circuits 31f and 31b of FIG. 30 carry out a latch operation to take in and latch decode signal DY in synchronization with the rise of clock signals FCLK and BCLK to generate column select signals FCS and BCS, respectively. In the latching state, latch circuits 31f and 31b each isolates an input node thereof from an output node thereof. Column decoder 30 drives decode signal DY to a selected state only when column decoder enable signal CDE (CDEF or CDEB) is active. Therefore, when column decoder 30 of FIG. 30 is active in response to column decoder enable signal CDEF, column select signal FCS from latch circuit 31f is rendered active. When latch circuit 31b enters a latch state in response to clock signal BCLK, column select signal BCS maintains the nonselected state since decode signal DY is inactive in response to inactivation of column decoder enable signal CDEF. Conversely, when column decoder 30 carries out a decode operation in response to column decoder enable signal CDEB, column select signal FCS is maintained at the inactive state since column decoder 30 is inactive when latch circuit 31f enters a latching state. When column decoder 30 carries out a decode operation in response to activation of column decoder enable signal CDEB, latch circuit 31b responds to clock signal BCLK, whereby column select signal BCS is generated according to decode signal DY from column decoder 30.

Column select signals FCS (FCS0–FCS3) and BCS (BCS0–BCS3) from latch circuits 31f and 31b are provided to column select gates FG0–FG3 and BG0–BG3, respectively. In memory sub arrays MAB0 and MAB1, a column select operation is carried out according to clock signals FCLK and BCLK, whereby data is transferred via internal data line pairs FIO and BIO. Preamplifiers FPA and BPA are rendered active in response to activation of preamplifier activation signals FPAE and BPAE, to carry out an amplify operation. Then, select signal φSEL is set to the state of selecting the output of preamplifier FPA for one clock cycle period. Then, select signal φSEL is set to the state of selecting the output of preamplifier BPA for the period of one clock clycle.

Column decoder enable signals CDEF and CDEB are applied to the column decoder of the memory sub array including the selected memory block according to the block address. This structure is easily implemented by using column decoder enable signals CDEU and CDED as signals CDEF and CDEB, respectively, in the structure of FIG. 25. Preamplifier enable signals FPAE and BPAE and select signal φSEL are sequentially rendered active according to column decode enable signals CDEF and CDEB since the timing of transmitting the data to internal data line pairs FIO and BIO is determined in advance.

Although the number of the internal data line pairs is increased in the structure of FIG. 28, the internal data lines can be arranged at a pitch condition substantially equal to that of the internal data bus structure of the I/O isolation structure. In this case, internal data transfer of high speed can be implemented by selecting a memory block in an interleaving manner using internal data line pairs FIO and BIO.

According to the structure shown in FIG. 28, all the data selected by selectors SC are applied in parallel to read transfer circuit 2a via internal data transmission bus DBB. However, a structure can be employed in which the output signal of selector SC is sequentially transferred to read transfer circuit 2a according to clock signal CLK (this structure is implemented by generating a signal that selects the output of the selector by the shift register structure).

[Modification 2]

Figure 32:
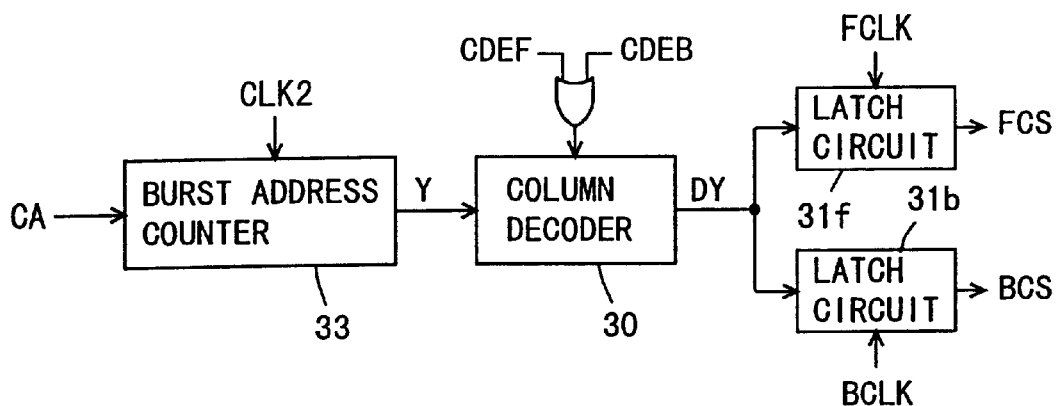
FIG. 32 schematically shows a further modification of the semiconductor memory device of the seventh embodiment.
Figure 35:
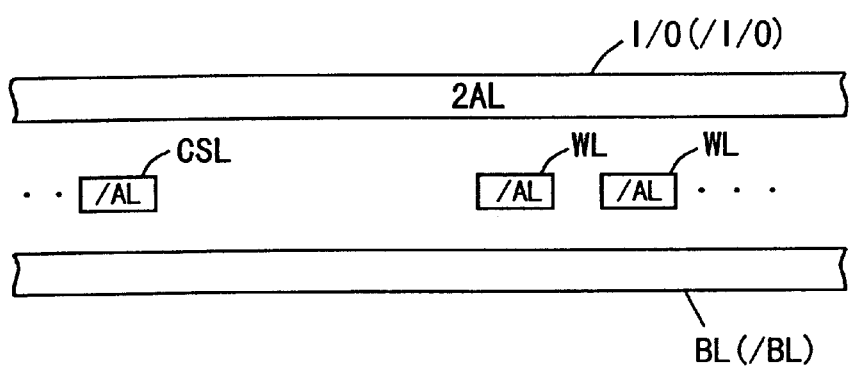
FIG. 35 schematically shows the position of the internal lines in an array portion of the conventional semiconductor memory device.
Figure 33:
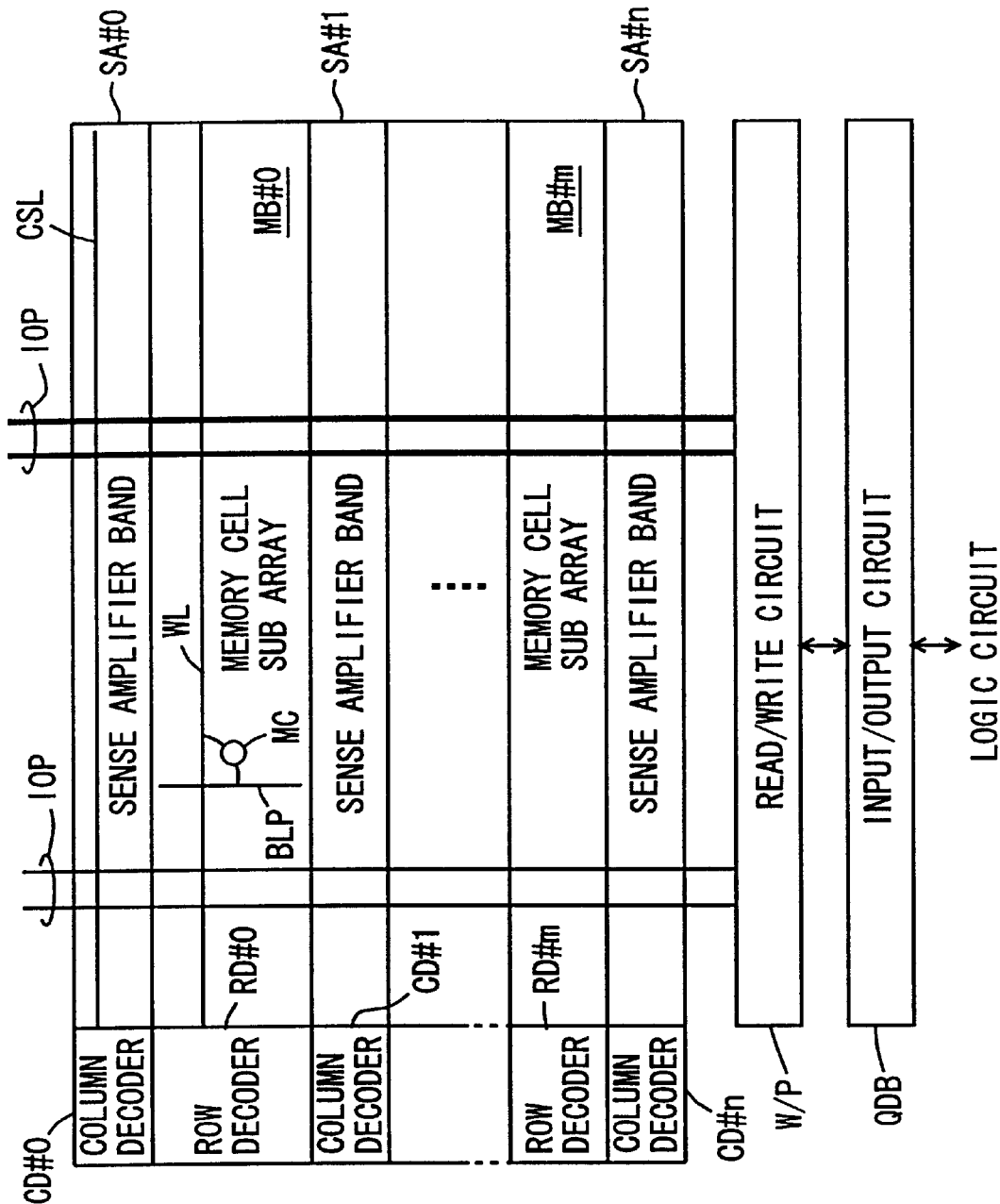
FIG. 33 schematically shows an entire structure of a conventional semiconductor memory device.
Figure 34:
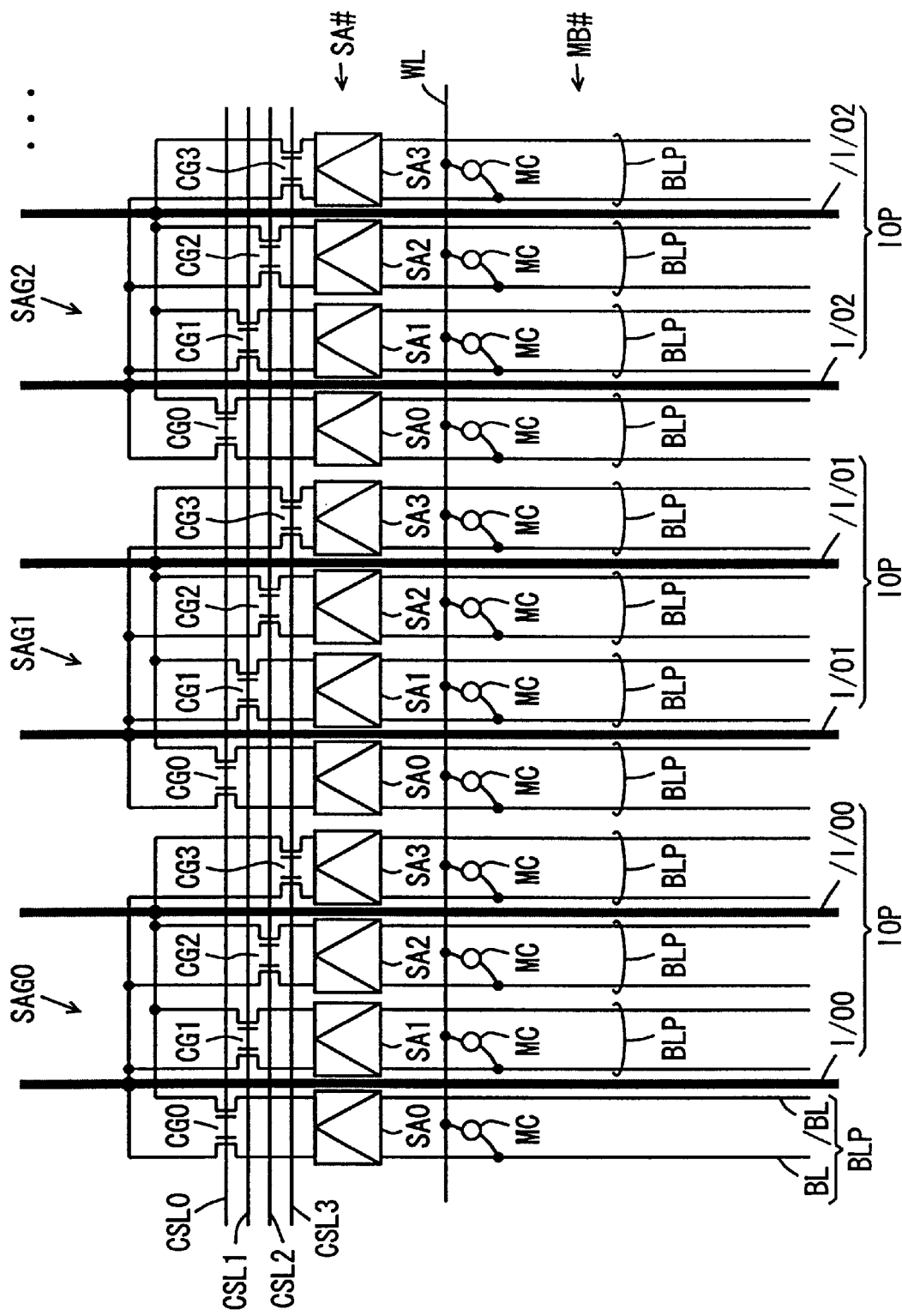
FIG. 34 schematically shows the structure of a sense amplifier band and an internal data line of the conventional semiconductor memory device.

FIG. 32 schematically shows a structure of a second modification of the seventh embodiment. In the structure shown in FIG. 32, a column address signal Y from a burst address counter 33 that operates according to frequency-multiplied clock signal CLK2 is applied to column decoder 30. An ORed signal of clock decoder enable signals CDEF and CDEB are applied as the enable signal to column decoder 30. The remaining structure is similar to that of FIG. 30, and corresponding components have the same reference characters allotted.

According to the structure of FIG. 32, column selection is sequentially carried out according to column address signal Y from burst address counter 33 in one memory block. Burst address counter 33 carries out a count operation with external column address signal CA applied at the application of a read command set as the initial value to generate column select signal Y. In the case where the burst length is, for example, 4, column select signals FCS0, BCS1, FCS2 and BCS3 are sequentially driven to a selected state. Accordingly, data of ¼ the number N of the sense amplifier circuits, i.e., data of N/4 bits can be sequentially transferred 4 times according to clock signal CLK2 in one memory block.

According to the seventh embodiment of the present invention, the data transfer frequency from the sense amplifier circuit to the internal data line pair is set two times greater than external data transfer clock frequency. Therefore, internal data transfer can be executed at high speed.

[Other Applications]

The present invention is applicable to any semiconductor memory device that has a block-divided structure and that operates in synchronization with a clock signal. The present invention is also applicable to the double data rate clock synchronization type semiconductor memory device that utilizes both the rising and falling edges of clock signal CLK when data is output.

As to the structure of doubling the internal data transfer rate from the sense amplifier circuit, the structure disclosed in page 105–106 in '97 Symposium on VLSI Circuits, Digest of Technical Papers by Hamamoto et al., for example can be employed.

According to the present invention, the internal data transfer rate of a logic-merged memory can be improved significantly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of memory blocks divided into first and second sub arrays along a column direction, each memory block including a plurality of memory cells arranged in rows and columns;

a plurality of sense amplifier circuits provided corresponding to columns in said plurality of memory blocks for sensing and amplifying memory cell data of corresponding columns when activated;

a plurality of internal data lines arranged extending along the column direction, each internal data line being provided corresponding to a predetermined number of sense amplifier circuits per one memory block, said plurality of internal data lines including a first group of the internal data lines provided for said first sub array and a second group of the internal data lines provided for said second sub array, the first group including a feed-through line arranged extending in the column direction over said second sub array and formed at an interconnection layer differing from an interconnection layer of the second group; and a plurality of column select circuits provided corresponding to the respective sense amplifier circuits and the respective internal data lines for coupling corresponding sense amplifier circuits to corresponding internal data lines according to a column select signal.

2. The semiconductor memory device according to claim 1, wherein the number of said plurality of internal data lines is identical to the number of the sense amplifier circuits provided for one memory block.

3. The semiconductor memory device according to claim 1, further comprising a plurality of power supply lines arranged extending along a row direction and corresponding to the memory blocks, transmitting an operating power supply voltage to a sense amplifier circuit provided for a corresponding memory block, wherein said feed-through line is provided at an upper layer than the power supply lines, and provided at a layer upper than said second group.

4. The semiconductor memory device according to claim 1, further comprising a plurality of power supply lines arranged extending along a row direction and corresponding to the memory blocks, transmitting an operating power supply voltage to a sense amplifier circuit provided for a corresponding memory block, wherein said feed-through line is provided at a lower layer than the power supply lines, and provided at a layer lower than said second group.

5. A semiconductor memory device comprising:

a plurality of memory blocks each including a plurality of memory cells arranged in rows and columns;

a plurality of word lines provided corresponding to respective rows of memory cells, each word line being connected to memory cells of a corresponding row connected;

a plurality of sense amplifier circuits provided corresponding to the columns in said plurality of memory blocks, for sensing and amplifying memory cell data of corresponding columns when activated;

a plurality of internal data lines each provided corresponding to a predetermined number of the sense amplifier circuits per one memory block and extending in a column direction over said plurality of memory blocks;

row select circuitry, for driving word lines arranged corresponding to addressed rows to a selected state simultaneously in a prescribed number of memory blocks in said plurality of memory blocks according to a row address signal;

column specify signal generation circuits provided corresponding to said plurality of memory blocks, each for generating a column specify signal specifying a column in a specified memory block according to a column address signal and a memory block specify address signal applied simultaneously; and a plurality of column select circuits provided corresponding to the respective sense amplifier circuits, for coupling the respective sense amplifier circuits of corresponding columns to corresponding internal data lines in response to said column specify signal.

6. A semiconductor memory device comprising:

a plurality of memory blocks each including a plurality of memory cells arranged in rows and columns;

a plurality of sense amplifier circuits provided corresponding to the columns in said plurality of memory blocks, for sensing and amplifying data of memory cells of corresponding columns when activated;

a plurality of internal data lines arranged extending along a column extending direction, each internal data line provided corresponding to a predetermined number of sense amplifier circuits per one memory block, and constituting a single end signal line; and a plurality of column select circuits provided corresponding to said plurality of sense amplifier circuits respectively and said plurality of internal data lines, for coupling corresponding sense amplifier circuits to corresponding internal data lines according to a column select signal.

7. The semiconductor memory device according to claim 1, wherein said internal data lines are arranged in a pair, the internal data line pair transferring complementary data.

8. The semiconductor memory device according to claim 1, wherein each the internal data lines constitutes a single end signal line.

9. A semiconductor memory device comprising:

a plurality of memory blocks each including a plurality of memory cells arranged in rows and columns, the memory blocks being divided into a plurality of banks that can drive a row to a selected state independent of each other;

a plurality of row select circuits provided corresponding to said plurality of banks respectively, each for driving, when a corresponding bank is addressed according to a bank address signal specifying a bank and a row address signal specifying a row applied simultaneously, a plurality of addressed rows simultaneously to a selected state in said corresponding bank;

a plurality of column select circuits provided corresponding to said plurality of banks, each column select circuit for selecting a plurality of columns simultaneously in a corresponding bank according to a bank address signal and a column address signal applied simultaneously; and a plurality of internal data lines provided extending in a column direction common to said plurality of banks, and coupled to the plurality of columns selected by said plurality of column select circuits.

10. A semiconductor memory device comprising:

a plurality of first memory blocks each including a plurality of memory cells arranged in rows and columns, the first memory blocks being divided into first and second sub arrays along a column direction;

a plurality of second memory blocks each including a plurality of memory cells arranged in rows and columns, the second memory blocks being divided into third and fourth sub arrays along the column direction;

a plurality of sense amplifier circuits provided corresponding to the columns in the first and second memory blocks, for sensing and amplifying data on corresponding columns when activated;

a plurality of first internal data lines extending along the column direction, each first internal data line being provided corresponding to a predetermined number of sense amplifier circuits per one first memory block, said plurality of first internal data lines including a first group of internal data lines provided for said first sub array and a second group of internal data lines provided for said second sub array, the first group including a first feed-through line arranged extending along the column direction over said second sub array and formed at an interconnection layer differing from an interconnection layer of the second group;

a plurality of second internal data lines extending along the column direction, each second internal data line being provided corresponding to a predetermined number of sense amplifier circuits per one second memory block, said plurality of second internal data lines including a third group of internal data lines provided for said third sub array and a fourth group of internal data lines provided for said fourth sub array, the fourth group including a second feed-through line arranged extending along the column direction over said third sub array and formed at an interconnection layer differing from an interconnection layer of the third group;

a plurality of first column select circuits provided corresponding to the columns of said first memory blocks and to said plurality of first internal data lines, for coupling corresponding columns to corresponding first internal data lines according to a first column specify signal;

a plurality of second column select circuits provided corresponding to the columns of said second memory blocks and to said plurality of second internal data lines, for coupling corresponding columns to corresponding second internal data lines according to a second column specify signal; and a read/write circuit arranged between said plurality of first memory blocks and said plurality of second memory blocks and coupled to the first and second internal data lines for data transfer.

11. The semiconductor memory device according to claim 1, wherein said plurality of internal data lines include a write data line for transmitting write data, and a read data line provided separate from said write data line for receiving and transferring data held in a corresponding sense amplifier circuit, each of said plurality of column select circuits comprises a write column select gate for connecting a corresponding write data line to a corresponding sense amplifier circuit according to a column address signal in a data write mode, and a read column select gate for transmitting data corresponding to data held in a corresponding sense amplifier circuit onto a corresponding read data line according to said column address signal in a data read mode.

12. A semiconductor memory device comprising:

a plurality of memory block each including a plurality of memory cells arranged in rows and columns;

a plurality of sense amplifier circuits provided corresponding to the columns in said plurality of memory blocks, for sensing and amplifying memory cell data of corresponding columns when activated;

a plurality of internal data lines extending along a column extending direction, each internal data line being provided corresponding to a predetermined number of sense amplifier circuits per one memory block;

a plurality of column select circuits provided corresponding to said plurality of sense amplifier circuits and to said plurality of internal data lines, for coupling corresponding sense amplifier circuits to corresponding internal data lines according to a column specify signal;

an internal clock generation circuit for receiving an externally applied clock signal to generate an internal clock signal of multiple phases; and a column select signal generation circuit operating in synchronization with each phase of the multiple phases of said internal clock signal for generating and providing to said plurality of column select circuits the column specify signal according to an applied signal in synchronization with said external clock signal.

13. The semiconductor memory device according to claim 1, further comprising:

a plurality of word lines provided corresponding to the rows of memory cells, each word line being connected to memory cells of a corresponding row;

row select circuits each provided corresponding to each memory block, for driving word lines arranged corresponding to addressed rows to a selected state simultaneously for a predetermined number of memory blocks out of said plurality of memory blocks according to a row address signal; and column specify signal generation circuits provided corresponding to the memory blocks each for generating, as said column select signal, a column specify signal specifying a column in a specified memory block according to a column address signal and a memory block specify signal applied simultaneously.

14. The semiconductor memory device according to claim 10, wherein each of the first and second internal data lines constitutes a single end signal line.

15. The semiconductor memory device according to claim 1, further comprising:

a plurality of second memory blocks each including a plurality of memory cells arranged in a matrix, the second memory blocks being divided into third and fourth sub arrays along the column direction;

a plurality of second internal data lines extending along the column direction, each second internal data line provided corresponding to a predetermined number of columns per one second memory block, said plurality of second internal data lines including a third group of internal data lines provided for said third sub array and a fourth group of internal data lines provided for said fourth sub array, the fourth group including a second feed-through line arranged extending along the column direction over said third sub array and at an interconnection layer differing from an interconnection layer of the third group;

a plurality of second column select circuits provided corresponding to the columns of the second memory blocks and to said plurality of second internal data lines, for coupling corresponding columns to corresponding second internal data lines according to a second column select signal; and a read/write circuit arranged between said plurality of memory blocks and said plurality of second memory blocks and coupled to said plurality of internal data lines and said plurality of second internal data lines for data transfer.

16. The semiconductor memory device according to claim 1, further comprising:

an internal clock generation circuit for receiving an externally applied clock signal to generate an internal clock signal; and a column select signal generation circuit operating in synchronization with said internal clock signal, generating and applying to said plurality of column select circuits said column select signal according to an applied address signal in synchronization with said external clock signal.

17. The semiconductor memory device according to claim 16, further comprising:

a plurality of first read amplifiers provided corresponding to the feed-through lines, for amplifying data on the feed-through lines when activated;

a plurality of second read amplifiers provided corresponding to the internal data lines of said second group, for amplifying data on the internal data lines of said second group when activated; and read control circuitry for activating a set of the first read amplifiers and a set of the second read amplifiers sequentially in a data read mode in accordance with said internal clock signal.

18. The semiconductor memory device according to claim 17, further comprising:

select circuitry for selecting the set of the first read amplifiers and the set of the second read amplifiers sequentially in said data read mode for transmission to data bus, in accordance with said externally applied clock signal.

19. The semiconductor memory device according to claim 12, further comprising:

a plurality of first read amplifiers provided corresponding to a first set of internal data lines among said plurality of internal data lines, for amplifying data on the first set of the internal data lines;

a plurality of second read amplifiers provided corresponding to a second set of other internal data lines among said plurality of internal data lines; and read control circuitry responsive to said applied address signal and said internal clock signal for sequentially activating a set of the first read amplifiers and a set of the second read amplifiers.

20. The semiconductor memory device according to claim 19, further comprising:

select circuitry responsive to said applied address signal for sequentially selecting the set of the first read amplifiers and the set of the second read amplifiers in accordance with said externally applied clock signal for coupling to a data bus.

21. The semiconductor memory device according to claim 19, wherein each of said plurality of column select circuits includes a first gate for coupling a corresponding column to an internal data line of said first set, and a second gate for coupling said corresponding column to an internal data line of said second set, the column specify signal being modified in synchronization with said internal clock signal, said first set of internal data lines and said second set of internal data lines being sequentially coupled to the columns selected by different column specify signals generated by said column select signal generation circuit.

* * * * *